(12) United States Patent
Achutharaman et al.

(10) Patent No.: US 8,110,828 B2
(45) Date of Patent: Feb. 7, 2012

(54) REAL TIME PROCESS MONITORING AND CONTROL FOR SEMICONDUCTOR JUNCTIONS

(75) Inventors: Vedapuram S. Achutharaman, Saratoga, CA (US); Wen Chang, Sunnyvale, CA (US); Tarpan Dixit, San Francisco, CA (US); Philip Kraus, San Jose, CA (US)

(73) Assignee: Solyndra LLC, Fremont, CA (US)

( * ) Notice: Subject to any disclaimer, the term of this patent is extended or adjusted under 35 U.S.C. 154(b) by 0 days.

(21) Appl. No.: 13/157,058

(22) Filed: Jun. 9, 2011

(65) Prior Publication Data
US 2011/0259391 A1 Oct. 27, 2011

Related U.S. Application Data

(62) Division of application No. 11/893,416, filed on Aug. 16, 2007, now Pat. No. 7,964,418.

(60) Provisional application No. 60/838,244, filed on Aug. 16, 2006.

(51) Int. Cl.
*H01L 29/08* (2006.01)

(52) U.S. Cl. ................... 257/42; 257/461; 257/E31.007

(58) Field of Classification Search ................ 257/42, 257/461, E31.007
See application file for complete search history.

(56) References Cited

U.S. PATENT DOCUMENTS

| | | | | |
|---|---|---|---|---|
| 6,162,296 | A * | 12/2000 | Kohara et al. | 118/666 |
| 6,518,086 | B2 * | 2/2003 | Beck et al. | 438/95 |
| 2005/0186342 | A1 * | 8/2005 | Sager et al. | 427/248.1 |
| 2006/0207644 | A1 * | 9/2006 | Robinson et al. | 136/243 |

* cited by examiner

*Primary Examiner* — Trung Q Dang
(74) *Attorney, Agent, or Firm* — Morgan, Lewis & Bockius LLP; Brett Lovejoy

(57) ABSTRACT

A method of manufacturing a semiconductor layer is provided. In a first deposition during a first period of time, at least one Group IIIA element and at least one Group VIA element are deposited on a substrate or on a layer optional disposed on the substrate such as a back-electrode. During a second deposition during a second period of time, at least one Group IB element and the at least one group VIA element are deposited on the substrate or the optional layer. The one Group IB element combines with the Group VIA element to form a $IB_2VIA$ composition. A first deposition state is monitored, during the second deposition by making a first plurality of measurements of a first deposition state. The second deposition is terminated or attenuated based on a function of the first plurality of measurements of the indicia of the first deposition state.

42 Claims, 9 Drawing Sheets

REAL TIME PROCESS MONITORING AND CONTROL FOR SEMICONDUCTOR JUNCTIONS

CROSS-REFERENCE TO RELATED APPLICATION

This application is a Divisional of 11/893,416 filed Aug. 16, 2007, now U.S. Pat. No. 7,964,418 which claims benefit of U.S. Provisional Patent Application No. 60/838,244, filed Aug. 16, 2006, which is hereby incorporated by reference herein in its entirety.

1. FIELD OF THE APPLICATION

This application relates to manufacturing of semiconductor junctions, in particular to using co-evaporation techniques to manufacture semiconductor junctions. Systems and methods for identifying critical control points of the processes for manufacturing semiconductor junction layers comprising multiple chemical elements are disclosed.

2. BACKGROUND OF THE APPLICATION

An important component of many devices, such as solar cells, is its semiconductor junction. In solar cells, a semiconductor junction converts energy from solar radiation into electrical energy. Traditionally, the semiconductor junctions of solar cells have been made from crystalline silicon. Typically, crystalline silicon solar cells are made of silicon wafers having a thickness ranging from 150 to 350 microns. However, silicon-based solar cells are expensive. Silicon has a band gap energy of 1.1 eV, which is at the lower range of effective semiconductors. Furthermore, extracting silicon and removing impurities from it require a large amount of raw material. The process itself consumes large amounts of energy and often results in considerable pollution.

New semiconductor materials and technologies have been developed to relieve solar cell industry's dependency on crystalline silicon and to improve the performance of existing solar cells. In particular, thin film solar cells have shown promising results and attracted considerable attention in recent years. Thin film solar cells are made of semiconductor materials that are often only a few micrometers thick. A typical thin film solar cell comprises two semiconductor layers. The first thin film layer is commonly referred to as the "window" layer or negative type (n-type) semiconductor. The window layer absorbs high energy light energy, but it must also be thin in order to let light pass through the n-type layer to the second semiconductor layer, which is known as the absorbing layer. The absorbing layer or positive type (p-type) layer has a band gap that permits absorption of photons. Less semiconductor material is required in a thin film solar cell, thereby reducing the cost of producing solar cells relative to crystalline silicon solar cells. Thin film photovoltaic cells have been developed using semiconductor materials such as amorphous silicon, cadmium telluride (CdTe), and copper-indium-diselenide (CIS), and copper-indium-gallium-diselenide (CIGS). In particular, CIGS has gained interest and study in recent years. A CIGS-like semiconductor layer can be as thin as a few microns, thus cutting down the cost of solar cell production. In addition, incorporating multiple elements in a semiconductor junction layer such as CIGS creates a graded band gap system, thereby permitting a broader spectrum of solar radiation to be absorbed.

Various processes have been developed to fabricate high efficiency CIGS films for solar cell applications. For example, two processes have been used at the National Renewable Energy Laboratory (NREL). The first involves selenization of a precursor containing copper (Cu), indium (In), and gallium (Ga) by a selenium vapor. Selenization is a process of heating Cu, In or Ga on a substrate in the presence of a selenium gas. A drawback of this process is that selenium-containing gas, such as $H_2Se$, is toxic and presents a health risk to humans in large scale production environments. The second involves growing CIGS from a Cu-rich precursor.

Recently, high efficiency CIGS-based solar cells have been made from $(In/Ga)_2Se_3$ precursor film based on a vacuum-based three-stage process. The three stage process is advantageous over previous approaches in that, at each stage, the depositing speed of each element may be controlled by stoichiometry. During the first stage, In, Ga, and Se are co-evaporated and deposited on a molybdenum-coated substrate made of soda lime glass. The co-evaporated elements combine and form a precursor film comprising $(In_xGa1-x)_2Se_3$. During the second stage, In and Ga depositions are stopped. Instead, only Se is co-evaporated with a new element, Cu, to further coat the substrate which passes through the first stage. At the second stage, the $(In_xGa_{1-x})_2Se_3$ precursor is exposed to a flux of Cu and Se with a [Se]/[Cu] ratio around three. Sufficient Cu is added in the second stage to bring the film composition into the range $1.1<[Cu]/([In]+[Ga])<0.95$. At the third stage, the remaining In and Ga is then co-deposited with Se in order to convert any excess Cu and Se into CIGS, to adjust the Ga content at the surface, and to construct a surface with potentially beneficial phases containing less Cu than the bulk. Finally, the films are cooled in a flux of Se to temperature around 350° C. The resulting p-type films are further processed to form solar cells by depositing additional layers including CdS, resistive ZnO, or conductive n-type ZnO:Al.

The CIGS films made based on the three stage process are smoother than other known processes and have large grains in the CIGS. They also, in general, have higher efficiency in converting solar radiation into electrical energy than CIGS manufactured by other methods. However, careful stoichiometry control during the three stage process is not enough to eliminate variations in quality, and such variations are still found in the CIGS films fabricated by this method. Such variations are almost inherent to CIGS films due to the multiple elements which are used in the process. Due to the different physical and chemical properties of the different elements, temperatures vary from stage to stage. For example, the first stage requires that the co-deposition of In, Ga, and Se be performed between 250° C. and 500° C. At the second stage and most of the third stage, process temperature has to be greater than 540° C. in order to facilitate CIGS formation. The final step takes place around 550° C. Temperature, batch material purity, and flux rate may result in inconsistency in energy conversion efficiency of the CIGS product. In addition, substrate material, shape, and size as well as back-electrode material and the methods of depositing back-electrode material may all have effect on the efficiency of the final CIGS product.

Given the above background, what is needed in the art are systems and methods to ensure the production quality of films used in solar cells.

Discussion or citation of a reference herein will not be construed as an admission that such reference is prior art to the present application.

3. BRIEF DESCRIPTION OF THE DRAWINGS

Like reference numerals refer to corresponding parts throughout the several views of the drawings. Dimensions are not drawn to scale.

4. DETAILED DESCRIPTION OF THE APPLICATION

The current application discloses systems and methods for monitoring and controlling the production of the multi-component semiconductor junctions such as CIGS based semiconductor junctions. The formation of a multi-component semiconductor junction often requires technologies such as reactive co-evaporation. The flux rate or evaporation rate of multiple components are often difficult to quantify and to control. As a result, the quality of the formed multi-component semiconductor junctions varies with reaction temperature, pressure of the reaction chamber, and the flux rate of each individual component. The current application provides systems and methods for identifying and utilizing critical control points during the fabrication of a multi-component semiconductor junction. Because most multi-component semiconductor junctions are produced by deposition processes containing multiple stages for more precise control, such critical control points are identified in individual stages and subsequently used to optimize the final formation of multi-component semiconductor junctions, for example, CIGS based semiconductor junctions. Systems and methods in accordance with the present application are applicable to any multi-component semiconductor device (e.g., solar cells).

4.1 Overview of the Process

Figure 1A:
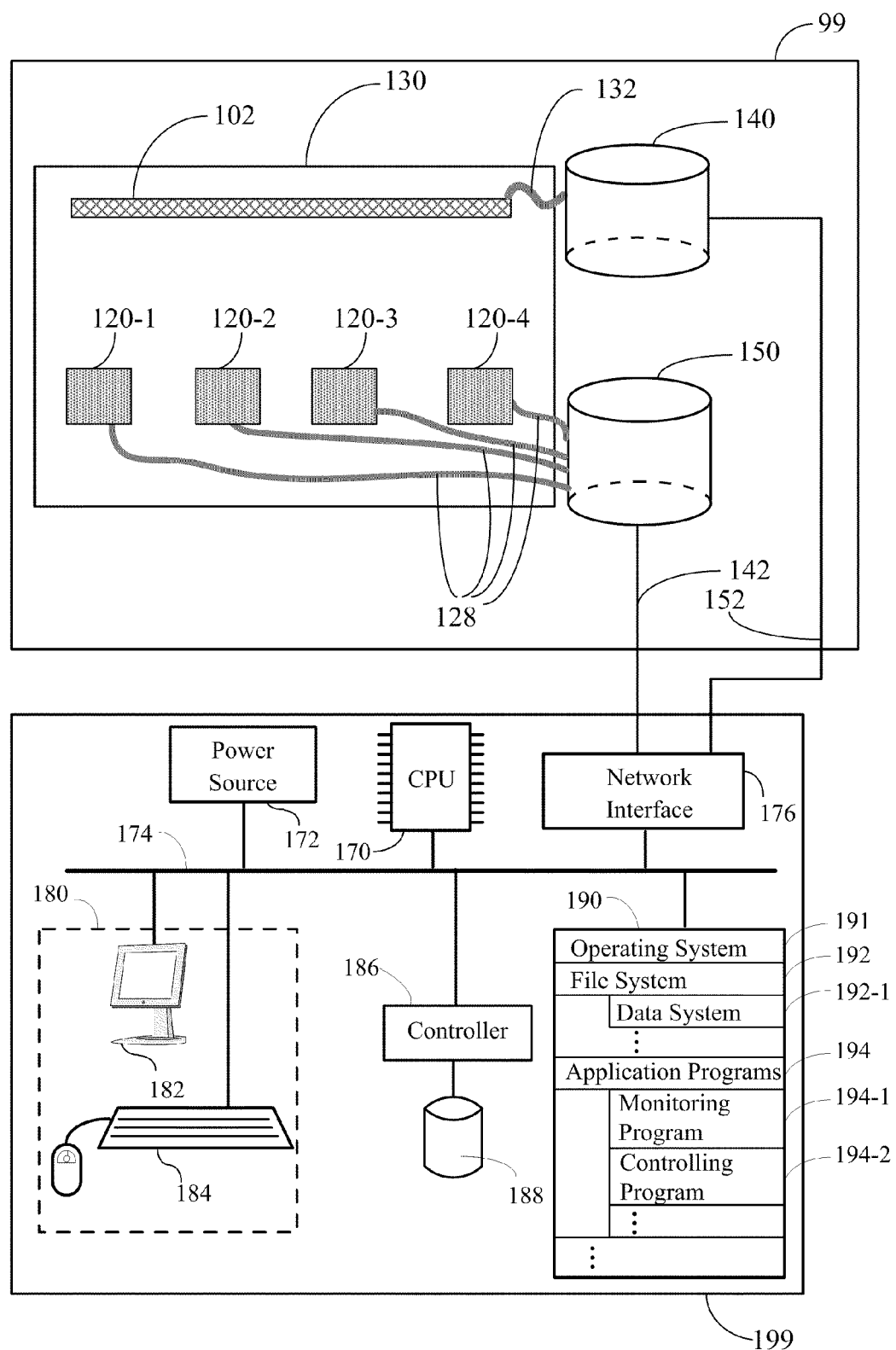
FIG. 1A depicts an apparatus in accordance with an aspect of the present application.

FIG. 1A depicts an exemplary system of an embodiment of the present application. Referring to FIG. 1A, an exemplary embodiment in accordance with the present application comprises a product module 99 and a computer 199. Product module 99 further comprises a compartment (e.g., vacuum chamber 130 in FIG. 1A) where CIGS or similar semiconductor layers are deposited onto a substrate 102, a monitoring unit 140, and a controlling unit 150. In some embodiments, the monitoring unit 140 and the controlling unit 150 may be combined as a single monitoring/controlling unit.

Computer 199, among other things, stores and processes measurements of one or more indicia that reflect at least one characteristic of the deposition process. In some embodiments, as depicted in FIG. 1A, computer 199 comprises a central processing unit 170, a user interface 180, a network interface 176, a memory 190, and a bus 174 to connect the aforementioned components. Computer 199 further includes a power source 172 to power the aforementioned components. Memory 190 may comprise random-access memory (RAM), read-only memory (ROM), flash memory and the like. In some embodiments, the memory 190 comprises high-speed RAM for storing system control programs, data, and application programs, e.g., programs and data loaded from the non-volatile storage 188 via the controller 186. In some embodiments, the user interface 180 comprises one or more input devices 184, e.g., keyboard, key pad, mouse, scroll wheel, and the like, and a display 182 or other output device. Network interface card or other network interface 176 provides a wired or wireless connection between the computer 199 and the monitoring unit 140 and/or the controlling unit 150.

In some embodiments, the memory 190 comprises an operating system 191, a file system 192, and application programs 194. The file system 192 may further comprise a data system 192-1 that stores any measurements recorded and transferred from the product unit 99. The application programs 194 may include a monitoring program 194-1 that facilitates measuring and recording of data to reflect a deposition state, and a controlling program 194-2 that analyzes any recorded data and controls the deposition state. In some embodiments, monitoring program 194-1 and controlling program 194-2 are combined in a single monitoring/controlling program that is capable of measuring and adjusting a deposition state.

Figure 1B:
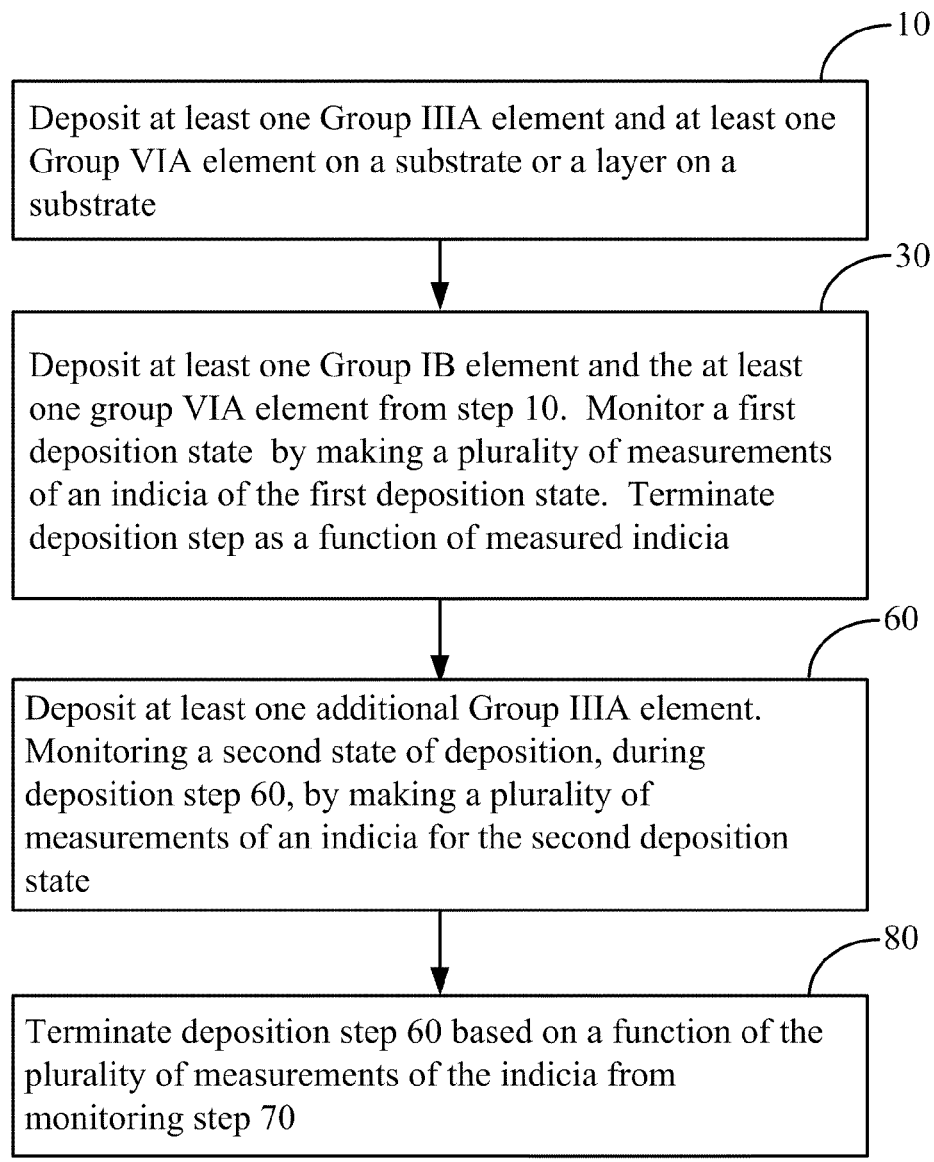
FIG. 1B depicts an exemplary process in accordance with an aspect of the present application.

FIGS. 1B and 1C outline an exemplary process for forming a multi-element semiconductor layer.

Step 10. Step 10 corresponds roughly to a first stage in a conventional three-stage CIGS production process. At this step, two or more elements (e.g., some combination of 120-1, 120-2, 120-3, and 120-4 of FIG. 1A) will be deposited onto the substrate 102. In some embodiments, the two or more elements 120 comprise at least one element from Group IIIA of the periodic table and at least one element from Group VIA of the periodic table. Step 10 is a co-deposition step for at least two elements from two different groups of the periodic table (e.g., one from Group IIIA and one from Group VIA). In some embodiments, the at least one Group IIIA element 120 comprises aluminum (Al), gallium (Ga), indium (In), thallium (Tl), or a combination thereof. In some embodiments, the at least one Group VIA element comprises sulfur (S), selenium (Se), tellurium (Te), or a combination thereof. In some embodiments, trace elements from other groups may be added to facilitate the co-deposition process at step 10.

In some embodiments, the deposition of the at least one Group IIIA or Group VIA element is achieved through physical vapor deposition (PVD), including but not limited to thermal evaporation, electron beam evaporation, sputtering, and pulsed laser deposition. In some embodiments, the deposition of at least one Group IIIA or Group VIA element is achieved by chemical vapor deposition (CVD), including but not limited to atmospheric pressure CVD, atomic layer CVD, aerosol assisted CVD, direct liquid injection CVD, hot wire CVD, low pressure CVD, metal organic CVD, microwave plasma-assisted CVD, plasma-enhanced CVD, rapid thermal CVD, remote plasma-enhanced CVD, ultra-high vacuum CVD, polysilicon deposition, and/or TEOS deposition. In some embodiments, the deposition of two or more elements is achieved through co-evaporation. Any suitable technology for depositing elements or compounds on any substrate may be used in accordance with the present application. Nonlimiting examples of additional deposition technologies are found in U.S. Pat. No. 7,235,736 which is hereby incorporated by reference herein in its entirety.

In some embodiments, the substrate 102 comprises glass, metal, high temperature plastic, ceramic or silicon. In some embodiments, the substrate 102 has a planar shape. In some embodiments, the substrate 102 has a rod-like or tubular shape. IN some embodiments all or a portion of the substrate 102 can be characterized by a cross-section bounded by any one of a number of shapes other than the circular shape depicted in FIG. 3B. The bounding shape can be any one of circular, ovoid, or any shape characterized by one or more smooth curved surfaces, or any splice of smooth curved surfaces. The bounding shape can also be linear in nature, including triangular, rectangular, pentangular, hexagonal, or having any number of linear segmented surfaces. The bounding shape can be an n-gon, where n is 3, 5, or greater than 5. Or, the cross-section can be bounded by any combination of linear surfaces, arcuate surfaces, or curved surfaces. The bounding shape can be any shape that includes at least one arcuate edge.

In some embodiments, a layer of back-electrode is deposited on substrate 102, for example, a layer of molybdenum (moly). In some embodiments, the molybdenum layer is deposited on the substrate 102 by thermal evaporation. In some embodiments, the molybdenum layer is deposited by sputtering. More description of the substrate 102 is found in Section 4.5 below.

In some embodiments, the co-deposition of Group IIIA and VIA elements last for 5 minutes or more, 10 minutes or more, 15 minutes or more, 25 minutes or more, 40 minutes or more, 60 minutes or more, or between 3 and 120 minutes. In some embodiments, at the end of step 10, the deposition of at least one of the Group IIIA element will be adjusted while the deposition of the at least one Group VIA element continues. In some embodiments, the deposition of the at least one Group IIIA element will be terminated. In some embodiments, the deposition of all elements at step 10 will be terminated.

In some embodiments, there is an incubation period between step 10 and step 30. In some embodiments, the incubation period is, for example, 5 minutes or more, 10 minutes or more, 20 minutes or more, 30 minutes or more, or between 3 and 120 minutes. In some embodiments, after the first co-deposition step 10, the substrate 102 is at least partially coated with a layer of Group IIIA and VIA elements. In some embodiments, a Group IIIA element and a group VIA element combine to form a precursor layer of $IIIA_2VIA_3$. In some embodiments, precursor $IIIA_2VIA_3$ is $(In_xGa_{1-x})_2(Se_yS_{1-y})_3$, where $0 \leqq x, y \leqq 1$. In other embodiments, precursor $IIIA_2VIA_3$ is $(In_xGa_{1-x})_2Se_3$, where $0 \leqq x \leqq 1$. In some embodiments, the co-deposition step 10 takes place at a substrate 102 temperature of 230° C. or higher, 240° C. or higher, 260° C. or higher, 270° C. or higher, 290° C. or higher, or 350° C. or higher. In some embodiments, the co-deposition step 10 takes place at a substrate 102 temperature of 250° C.±5° C., ±10° C., or ±15° C. In some embodiments, the co-deposition step 10 takes place at a substrate 102 temperature of 300° C.±5° C., ±10° C., or ±15° C. In some embodiments, the co-deposition step 10 takes place at a substrate 102 temperature of 350° C.±5° C., ±10° C., or ±15° C. In some embodiments, additional doping elements or compounds are added to manipulate the structure of the precursor layer.

Step 30. At this step, a new element 120 (e.g., a Group IB element) is co-deposited, with the previously deposited one or more Group VIA elements, onto the $IIIA_2VIA_3$ precursor layer on substrate 102. In some embodiments, the newly deposited Group IB element comprises Cu, Ag, Au, or any combination thereof. In some embodiments, the newly deposited element further comprises any other elements that may facilitate the formation of the semiconductor layer. In some embodiments, the semiconductor layer is a layer of $IB/IIIA/VIA_2$. In some embodiments, the semiconductor layer is $CuIn_{1-x}Ga_xSe_2$, where $0 \leqq x \leqq 1$. In other embodiments, the semiconductor layer is $CuIn_{1-x}Ga_x(Se_yS_{1-y})_2$, where $0 \leqq x, y \leqq 1$. $CuIn_{1-x}Ga_xSe_2$ and $CuIn_{1-x}Ga_x(Se_yS_{1-y})_2$ are collectively referred to as CIGS throughout this application as examples of the multi-element/component semiconductor layers that are used in solar cell applications.

Advantageously, at step 30, at least a portion of one Group IB element combines with one Group VIA element to form $IB_2VIA$. In some embodiments, $IB_2VIA$ is $Cu_2Se$. At step 30, in some embodiments, the reaction of Cu and Se with a $(In_xGa_{1-x})_2Se_3$ precursor layer result in the spontaneous formation of a graded $CuIn_{1-x}Ga_x(Se_yS_{1-3})_2$ layer where x varies through the depth of the deposited semiconductor layer. Such a grading in the quantity $[Cu]/([In]+[Ga])$ corresponds to a grading of band gaps, where [Cu], [In], and [Ga] represent the quantities of the corresponding elements. For example, $CuInSe_2$ has a band gap of 1.04 eV, and $CuGaSe_2$ has a band gap of 1.67 eV. Additional manipulations of the $[Cu]/([In]+[Ga])$ ratio and $[Ga]/[In]$ ratio result in additional varied and graded band-gap structures.

In one exemplary embodiment, the $[Cu]/([In]+[Ga])$ ratio is used as an indicator for controlling the deposition process at step 30. In this exemplary embodiment, it is also used as an indicator of the quality of the final CIGS product. In some embodiments, efficient CIGS films have a $[Cu]/([In]+[Ga])$ ratio between 0.85 and 0.95. This ratio, however, cannot be used as the sole indictor in evaluating CIGS qualities. Due to the inherent complication of a multi-element deposition process, CIGS films with the same $[Cu]/([In]+[Ga])$ ratio may end up having different conversion efficiencies.

As noted, in some embodiments at the second co-deposition step 30, a Group IB element and a Group VIA element may combine to form a salt of the form $IB_2VIA$. In some embodiments, the $IB_2VIA$ composition is $Cu_2Se$. It has been shown that the presence of $Cu_2Se$ facilitates CIGS growth at the second stage. When $Cu_2Se$ is present, CIGS with larger grain size and higher efficiency may be formed. In some embodiments, $Cu_2Se$ formation is achieved by temporarily allowing the $[Cu]/([In]+[Ga])$ ratio to reach or exceed 1. Conventionally, this is done by controlling the stoichiometry ratio of the elements. However, the process is complicated by many variations in the complex reaction of CIGS formation. In most embodiments, CIGS formation and Cu, Se co-deposition are achieved at a temperature much higher than that at the first stage. In some embodiments, reaction temperature at step 30 is 300° C. or higher, 350° C. or higher, 400° C. or higher, 450° C. or higher, 500° C. or higher, 520° C. or higher, 560° C. or higher, or 600° C. or higher, 650° C. or higher, or 700° C. or higher. Under such conditions, $Cu_2Se$ is a liquid; its interactions with $CuIn_{1-x}Ga_xSe_2$ as well as with Cu and Se vapors are very complex. Slight variation, including trace impurity in any element, can result in imperfect CIGS formation. Even precise and accurate control of the $[Cu]/([In]+[Ga])$ ratio and reaction temperature cannot guarantee consistent formation of high quality CIGS films.

In SOME embodiments in accordance with the present application, monitoring and controlling steps are added to improve the quality of the semiconductor layer. Referring to FIG. 1A, in some embodiments, a monitoring unit 140 and a controlling unit 150 are connected to the reaction chamber to monitor a deposition state during, for example, step 30. In some embodiments, the deposition state is defined as a parameter associated with co-deposition step 30. Exemplary parameters include, but are not limited to, for example, the temperature of the substrate 102, the refractive index of the semiconductor layer, the mass or density of the semiconductor layer, the infrared signal of the semiconductor layer, the conductance of the semiconductor layer, the vapor pressure of the chamber 130, or any other parameter that may be used to reflect a characteristic of the deposition step 30. In some embodiments, measurements of the deposition state are done by monitoring unit 140 which, in some embodiments, is connected to the substrate 102 via a connection 132 in the manner depicted in FIG. 1A. In some embodiments, measurements are recorded and transferred to the computer 199 for storage and further processing. For example, the temperature of the substrate 102 can be measured, recorded, and transferred to the computer 199. In some embodiments, a monitoring unit 140 is connected to the reaction compartment 130 or any other part of the reaction compartment that reflects a deposition state of the co-deposition step 30. In some embodiments, the controlling unit 150 is connected to the depositing element or the compound 120 via the connection 128 such that the rate of deposition of a corresponding element or the compound 120 can be altered by adjusting the controlling unit 150, for example, by tuning down the deposition temperature of the corresponding element or compound. In some embodiments, the temperature of the substrate 102 is controlled throughout the deposition process such that it remains in the range of 300° C. to 700° C. In some embodiments, the temperature of the substrate 102 is controlled throughout the deposition process such that it remains in the range of 400° C. to 600° C.

In some embodiments, measurement and adjustment of a deposition state is done automatically. For example, a program using user interface 180 can be programmed to perform such measurements. Alternatively, such programming can be coded into an application chip such as an application specific integrated circuit (ASIC). A user may decide how frequently measurements are performed. For example, a parameter associated with co-deposition step 30 can be measured at 5 nanosecond intervals or greater, 5 millisecond intervals or greater, 5 second intervals or greater, 1 minute intervals or greater. Further, there is no requirement that such measurements be taken at uniform time intervals. In some embodiments, such measurements are taken in non-uniform time intervals. In some embodiments, each measurement is taken on a conditional basis. For example, in some embodiments additional measurements are taken on a uniform or nonuniform basis until the parameter associated with co-deposition step 30 (i) falls below a threshold value, (ii) rises above a threshold value, or (iii) changes at a rate that is faster (greater) than a threshold change. The measurements are recorded and, in some embodiments, processed, for example, by monitoring unit 140 and computer 199. In some embodiments, data processing methods and techniques are used to help identify any variation in the measurements of the deposition state. For example, in some embodiments, a first derivative with respect to time of the parameter measurements (e.g., temperature of the substrate 102, etc.) is computed (e.g., by considering the past 2, 3, 4, 5, 6, 7, 8 or more measurements) to more clearly identify any variation in the measurements. In some embodiments, such computation is further facilitated by computation of the second derivative with respect to time of such measurements.

Any variations in a deposition state, either as recorded measurements or as a function (e.g., first derivative with respect to time, second derivative with respect to time) of such recorded measurements, are used to determine whether the deposition state should be altered. In some embodiments, when the parameter (e.g. temperature of substrate 102) reaches a pre-determined value, the deposition is adjusted. For example, when temperature measurements of the substrate 102 reaches a plateau, as indicated by a first-order derivative value with respect to time of zero or close to zero, the deposition rate in step 30 may be attenuated or altogether terminated. In some embodiments, attenuation or termination of the deposition rate in step 30 may occur when the first-order derivative of the temperature measurements with respect to time reaches its minimum. In some embodiments, attenuation or termination of the deposition rate in step 30 may occur at any time point between when the first-order derivative of the temperature measurements with respect to time reaches zero and when it reaches its minimum. In some embodiments, the attenuation or termination occurs 10 seconds or fewer, 20 seconds or fewer, 50 seconds or fewer, 100 seconds or fewer, 200 seconds or fewer, or 500 seconds or fewer after the first-order derivative with respect to time reaches zero. In some embodiments, the attenuation or termination occurs 10 seconds or fewer, 20 seconds or fewer, 50 seconds or fewer, 100 seconds or fewer, 200 seconds or fewer, or 500 seconds or fewer after the first-order derivative with respect to time reaches a minimum value.

In some embodiments the temperature of the substrate 102 nearly doubles that of the first depositing step 10 during step 30 and CIGS films form as Cu and Se co-deposition proceeds.

Step 60. At the completion of step 30, most Group IIIA element, e.g., In and Ga, should have been incorporated to form CIGS grains. In some embodiments, excess $IB_2VIA$ is left at the end of step 30. At step 60, the third depositing step, more Group III and Group VIA elements is deposited to incorporate any residual $IB_2VIA$ to form additional IB/IIIA/$VIA_2$ (e.g., CIGS). Although the majority of CIGS growth occurs prior to step 60, CIGS production proceeds further in step 60 to ensure that little or no residual $IB_2VIA$ remain before the CIGS production process ends. $IB_2VIA$ compounds such as $Cu_2Se$ enhance grain size of CIGS crystals. Excess $Cu_2Se$ on CIGS films, however, is typically detrimental to efficiency of such films. Additional Group III and Group VIA elements are deposited to neutralize excess $Cu_2Se$ in some embodiments. Like the second depositing step 30, the third depositing step 60 is also affected by various factors such as reaction temperature, vapor pressure, etc. A second deposition state is measured to ensure the formation of high quality CIGS films. Additional monitoring and controlling steps are imposed to achieve such purpose.

In some embodiments, there is a time gap between steps 30 and 60 in which no material is deposited. This time gap can be, for example, ten microseconds or more, 100 microseconds or more, 1000 microseconds or more, $1 \times 10^4$ microseconds or more, $1 \times 10^5$ microseconds or more, $1 \times 10^6$ microseconds or more, $1 \times 10^7$ microseconds or more, or $1 \times 10^8$ microseconds or more. In other embodiments, there is no time gap between steps 30 and 60.

A second deposition state is monitored during step 60 using the same or different methods to those described in step 30. In some embodiments, the second deposition state that is monitored is the same as the first deposition state that was monitored in step 30. In some embodiments, the second deposition state that is monitored is different than the first deposition state that was monitored in step 30. For example, instead monitoring the temperature of the substrate 102 as was done in some embodiments during step 30, the substrate 102 conductance is measured during step 60. In some embodiments, the deposition state that is monitored in step 60 is a parameter associated with step 60, for example, the temperature of the substrate 102 during step 60, the refractive index of the semiconductor layer during step 60, the mass or density of the semiconductor layer during step 60, the infrared signal of the semiconductor layer during step 60, the conductance of the semiconductor layer during step 60, the vapor pressure of chamber 130 during step 60, or any other parameters that may be used to monitor a characteristic of the third deposition step 60.

In some embodiments, the second deposition state is monitored in the same way the first deposition state was monitored in step 30 by monitoring the unit 140, the controlling unit 150 and storing as well as analyzing such information using the computer system 199. In some embodiments, the monitoring that occurs in step 60 is performed throughout step 60. In the same manner as explained above in step 30, additional data processing techniques may be applied to identify any changes in the second deposition state. For example, in some embodiments, the temperature of the substrate 102 is monitored continuously throughout steps 30 and 60. First order and second order derivatives of the temperature measurements with respect to time are performed by a monitoring program 194-1 on computer 199. Alternatively, such analyses are performed by a combined monitoring/controlling program on the computer 199. Alternatively still, such analyses are performed using other calculation devices such as an application specific integrated circuit (ASIC).

Step 80. At step 80, based on a pre-determined value set forth for the second deposition state, co-deposition of Group IIIA and VIA elements may be attenuated and terminated. For example, the co-deposition of Group IIIA and VIA elements may be terminated when a first-order derivative of the temperature measurements of substrate 102 with respect to time reaches its maximum. Alternatively, the co-deposition of Group IIIA and VIA elements may be terminated within a time range when a first-order derivative of the temperature measurements of the substrate 102 with respect to time reaches its maximum. In some embodiments, the attenuation or termination occurs 1 second or fewer, 10 seconds or fewer, 20 seconds or fewer, 50 seconds or fewer, 100 seconds or fewer, or 200 seconds or fewer, after the first-order derivative with respect to time reaches a maximum.

In some embodiments in accordance with the present application, the monitoring and controlling process only occur once during the production of the production of a multi-component semiconductor layer, for example, during a two-stage process of CIGS film production.

Exemplary description of multi-component semiconductor layer production using CIGS is found in Gabor et al., 1994, "High-efficiency $CuIn_xGa_{1-x}Se_2$ solar cells made from $(In_xGa_{1-x})_2Se_3$ precursor films," *Applied Physics Letters* 65(2): 198-200; Gabor et al., 1994, "Band-gap engineering in $Cu(In,Ga)Se_2$ thin films grown from $(In,Ga)_2Se_3$ precursors," Conference Record of the Twenty Fourth; IEEE Photovoltaic Specialists Conference 1994, 1994 IEEE First World Conference Volume 1, December 1994 issue: 83-86; Contreras et al., 1994, "High efficiency $Cu(In,Ga)Se_2$-based solar cells: processing of novel absorber structures," Conference Record of the Twenty Fourth; IEEE Photovoltaic Specialists Conference 1994, 1994 IEEE First World Conference on Volume 1, December 1994 Issue: 68-75; Ramanathan et al., 2003, "Properties of 19.2% efficiency $ZnO/CdS/CuInGaSe_2$ thin-film solar cells," National Renewable Energy Laboratory, *Progress in Photovoltaics: Research and Applications* 11(4): 225-230; Beck and Repins, 2004, National Renewable Energy Laboratory Phase I and Phase II annual reports; each of which is hereby incorporated by reference herein in its entirety. Additional references are also found in U.S. Pat. No. 6,566,162, U.S. Patent Application Publication Number 2004/0206390, U.S. Patent Application Publication Number 2006/012170, and U.S. Patent Application Publication Number 2006/0102230, each of which is hereby incorporated by reference herein in its entirety.

The vacuum chamber based deposition process is provided herein by way of illustration and therefore should not limit the scope of the present application. Non-vacuum based deposition technologies have been described and may be applied in embodiments of the present application. Examples of non-vacuum based deposition technologies may be found in Kapur et al., 2005, "Non-vacuum processing of CIGS solar cells on flexible polymeric substrates," Photovoltaic Energy Conversion, *Proceedings of 3rd World Conference May 11-18*, 2003 Volume 1: 465-468; Eberspacher et al., 2002, "Non-vacuum processing of CIGS solar cells," *Conference Record of the Twenty-Ninth IEEE Photovoltaic Specialists Conference*, May 19-24 2002, pages 684-687; and Kapur et al., 2003 "Non-Vacuum Processing of $CuIn_{1-x}Ga_xSe_2$ Solar Cells on Rigid and Flexible Substrates using Nanoparticle Inks," *Thin Solid Films, Proceedings of Symposium B, European Materials Research Society*, Strasbourg, France, Vol. 431-432:53-57; each of which is hereby incorporated by reference herein in its entirety.

4.2 Exemplary Methods for Monitoring a Deposition State

Monitoring of processes such as thin film deposition, evaporation, sputtering, and laser ablation are done through various methods. For example, the quantity of material coated onto a substrate may be measured by detecting a weight change of the substrate. In addition to detecting material quantity, other parameters can be determined. For example, in some embodiments, a determination is made as to how fast and in which direction material is being coated onto the substrate. Such information helps to determine deposition rates, velocity profiles inside process chambers, sticking coefficients, and many other technical parameters. Other rate monitoring methods include, but are not limited to, using devices such as quartz crystal monitors (QCM), quadrupole mass spectrometers (QMS), ion gauges, and electron impact emission spectrometers (EIES). In some embodiments, a dual-channel co-evaporation EIES controller is provided for both monitoring and controlling the In/Cu ratio. In some embodiments, the co-evaporation controller is a Sigma Instruments EIES-IV Guardian.

An EIES monitoring system admits evaporated material. The vapor flux of the admitted material collides with electrons emitted from a filament within the EIES monitoring system, thus raising the energy state of the valence electrons. When the electrons return to lower energy states, photons are emitted. Characteristics of the emitted photons (e.g., wavelength) are recorded to reflect the characteristics of the evaporated material. An EIES monitoring system may be used to dynamically determine the composition of co-evaporated materials. EIES monitoring systems are described in U.S. Pat. No. 3,612,859 to Schumacher, which is hereby incorporated by reference herein in its entirety.

Figure 2A:
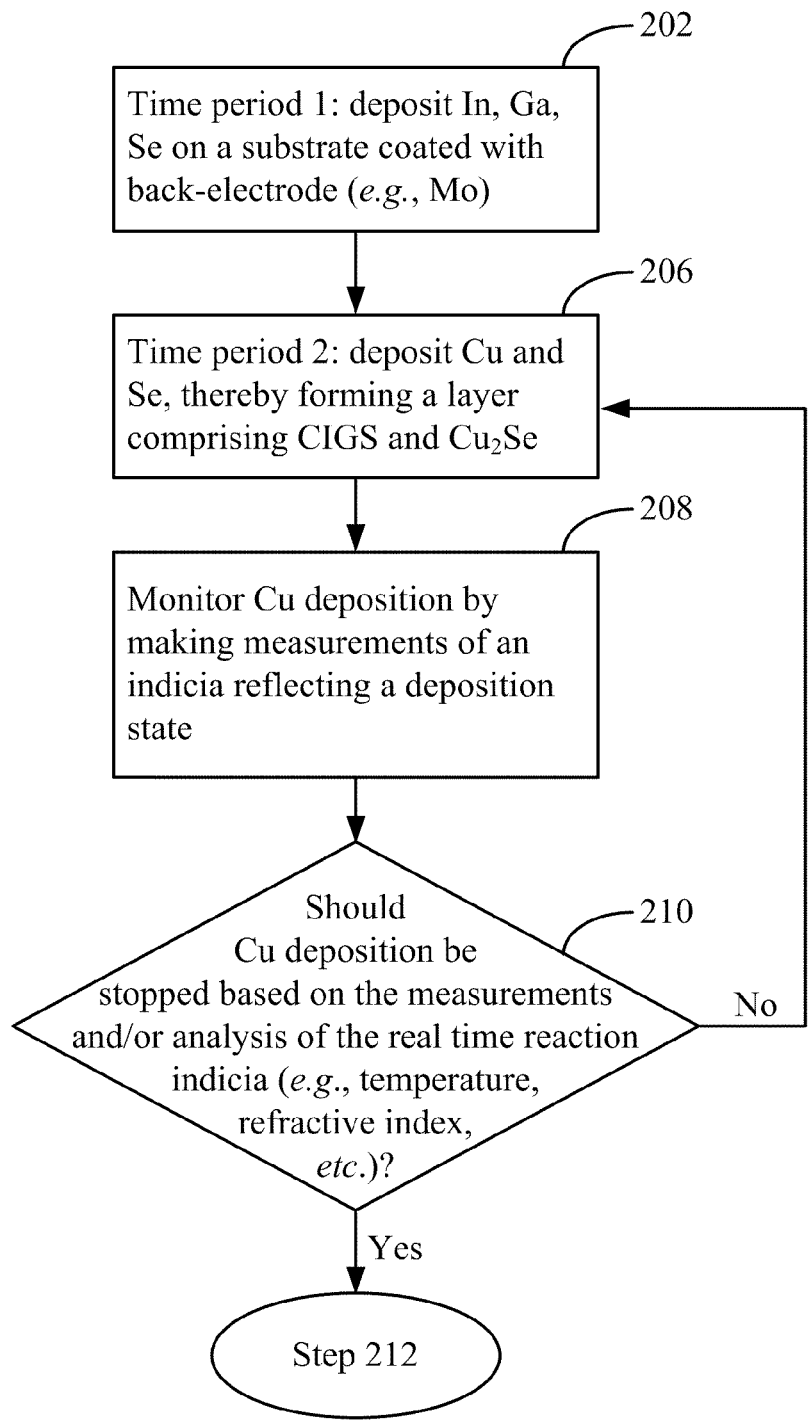
FIGS. 2A-2B depict an exemplary process in accordance with the present application.
Figure 2B:
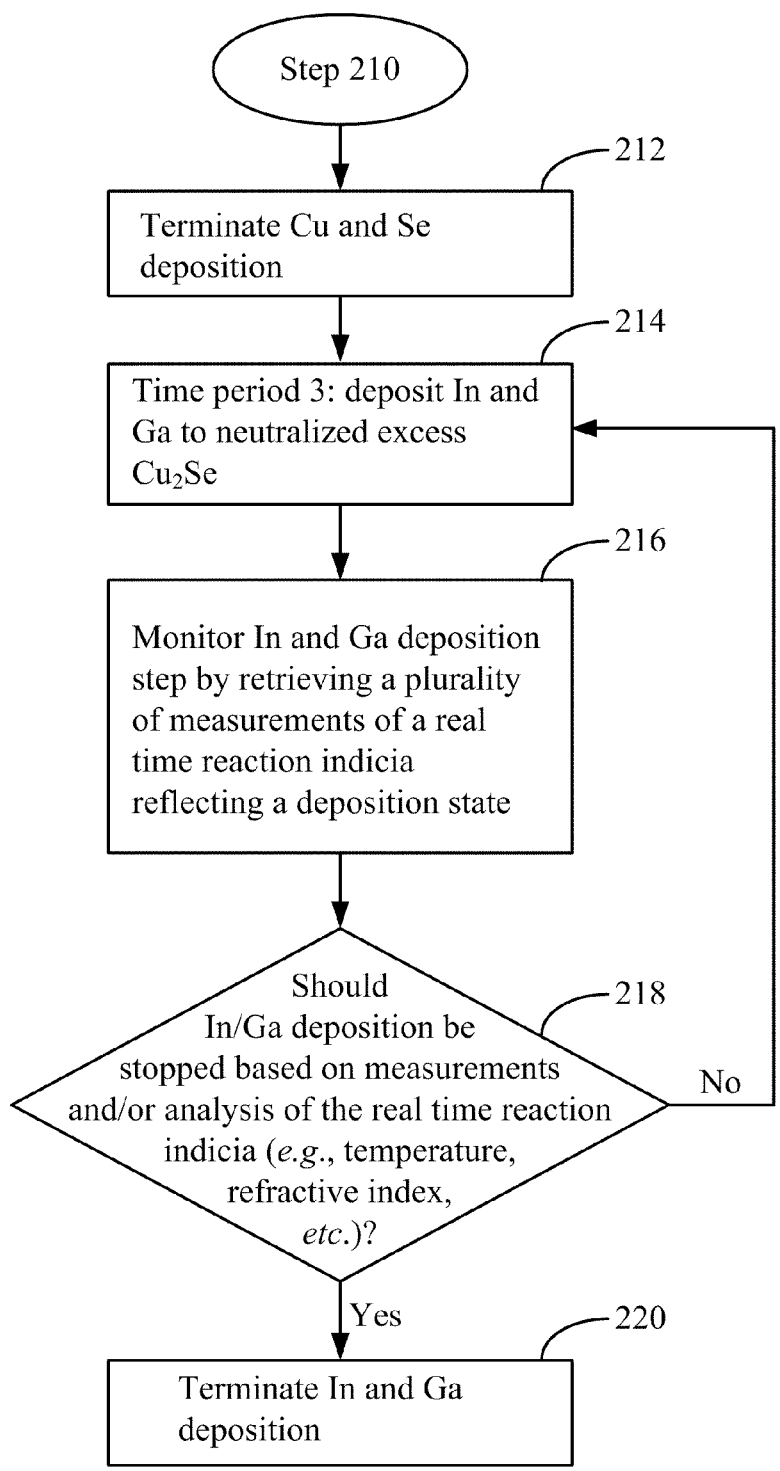

An exemplary embodiment in accordance with a three-stage process for CIGS formation is outlined in FIGS. 2A and 2B. An EIES monitoring system may be placed inside a device where co-evaporation takes place, for example the reaction chamber 130 in FIG. 1A. In some embodiments, the EIES monitoring system may be placed adjacent to substrate 102. In some embodiments, the EIES monitoring system may be placed adjacent to the evaporation sources, for example, elements 120 in FIG. 1A.

Step 202. At step 202, the CIGS deposition process is initiated through co-evaporation of In, Ga, and Se onto the substrate 102. In some embodiments, the substrate 102 is a tubular glass substrate coated with a molybdenum layer. In some embodiments, the co-evaporation process at step 202 is monitored and controlled by an EIES system. In some embodiments, the co-evaporation process at step 202 is a time controlled process. In some embodiments, a layer of $(In_xGa_{(1-x)})_2Se_3$, where x is in the range of 0 to 1, is formed during this first deposition step.

Step 206. At step 206, In and Ga evaporation is terminated or severely attenuated. Instead, a new element, Cu is co-evaporated in the presence of Se. During step 206, granular CIGS crystals are formed. In some embodiments, $Cu_2Se$ is formed to facilitate the formation of high quality CIGS.

Step 208. In embodiments in accordance with the present application, the co-evaporation of Cu and Se is monitored, for example, as depicted at step 208 of FIG. 2A. In some embodiments, an indicia that reflects a first deposition state is determined by an EIES monitoring system. In some embodiments, at given time points, a sensor of the EIES monitor system is positioned so as to permit evaporated Se and Cu in the vapor stream to enter the miniature sensor structure (not shown) where the evaporant is cross-bombarded by a low energy electron beam. In some embodiments, measured wavelengths are generally in the 2000 Å to 5000 Å ultraviolet and visible light region and are precisely characteristic of the atomic species. The number of photons emitted (light intensity) is proportional to evaporant density in the sensor so that light intensity is then proportional to evaporation rate. In some embodiments, by using narrow band pass optical filters and/or monochrometers, multiple specific materials can be simultaneously monitored and rate controlled. In some embodiments, a dual channel EIES monitoring system may be equipped with an optical band pass filter on one channel to monitor one element (e.g. 4500 Å to measure In), and a monochrometer set at another wavelength on the other channel to monitor another element (e.g., 3250 Å to measure Cu).

In some embodiments, a deposition state (for example, the deposition rate of an element) may also be monitored by a quartz crystal microbalance deposition controller. For example, the vaporization rate of Se from sources 120 may be monitored and controlled by such a microbalance controller. Typical deposition rates are between 0.5 Å/second and 20 Å/second for Cu, In, and Ga. The deposition rate for Se is usually higher, for example from 5 Å/second up to 1000 Å/second. In some embodiments, the evaporation/deposition rate for Se is controlled such that it is 1.0 times to 4.0 times the metal evaporation rates.

In some embodiments, the particular sensor/controller employed may vary dependent upon specific system requirements. For example, the system may employ a mass analyzer. Reflection and transmission electron diffraction methods may also be used to characterize the grain size and resistivity of the semiconductor layer during its formation.

In some embodiments, the deposition state is monitored and controlled by monitoring the temperature of the substrate 102. A temperature probe may be positioned adjacent to the substrate 102. In some embodiments, the temperature probe may be positioned within a tubular substrate. In alternative embodiments, the deposition state is monitored by measuring physical properties (e.g., the refractive index, reflectivity, emmisivity) of the coated layer during the deposition process.

The methods and systems for characterizing a deposition process are provided herein for illustration purpose. They should not be construed as limitations on the scope of the present application.

Step 210. At step 210, the results from monitoring steps 206 and 208 are evaluated based on pre-determined parameters to identify a first critical control point. In some embodiments, the first critical control point is defined by the formation of $Cu_2Se$. It has been demonstrated that the formation of $Cu_2Se$ facilitates CIGS growth. Advantageously, in some embodiments, the pre-determined parameter is the formation of $Cu_2Se$. In some embodiments, the formation of $Cu_2Se$ is indicated by a change of the temperature of substrate 102 or a change of a physical property (e.g., refractive index, reflectivity, emmisivity, etc.) of a coated layer on the substrate 102. In some embodiments, the first control point is readily identifiable based on a plurality of measurements of indicia such as temperature, refractive index, reflectivity, emmisivity, or other physical properties. In some embodiments, the first control point may only be identified based on a function of a plurality of measurements of such indicia. In some embodiments, the function may be a first order derivative of the plurality of measurements of such indicia with respect to time. In some embodiments, the function may be a second order derivative of the plurality of measurements of such indicia with respect to time.

Steps 212-214. Referring to FIG. 2B, at step 212, the evaporation of Cu is terminated or severely attenuated. Although the presence of $Cu_2Se$ facilitates CIGS growth, $Cu_2Se$ is eliminated after CIGS growth to maintain the efficiency of the semiconductor layer. At step 214, In and Ga are co-evaporated to neutralize any excess $Cu_2Se$. The co-evaporation of In and Ga is monitored through steps 214 to 218 (also known as the third time period). In some embodiments, systems and methods as described for steps 206 to 210 are used to monitor the In and Ga co-evaporation process.

Step 216. At step 216, a second evaporation state is monitored to reflect the characteristics of the In and Ga co-evaporation process. In some embodiments, the process is monitored by an EIES monitoring system. In some embodiments, the deposition state is monitored and controlled by monitoring the temperature of substrate 102. A temperature probe may be positioned adjacent to substrate 102. In some embodiments, the temperature probe may be positioned within a tubular substrate. In alternative embodiments, the deposition state is monitored by measuring a physical property (e.g., temperature, refractive index, reflectivity, and/or emmisivity, etc.) of the coated layer during the deposition process.

Step 218. At step 218, the results from the monitoring steps 214 and 216 are evaluated based on pre-determined parameters to identify a second critical control point. In some embodiments, the critical control point is defined as the time when excess $Cu_2Se$ is neutralized by co-evaporation of In/Ga/Se throughout step 216. In some embodiments, the neutralization of $Cu_2Se$ is indicated by a change of the temperature of substrate 102 or a change of the refractive index of a coated layer on substrate 102. In some embodiments, the second control point is readily identifiable based on a plurality of measurements of indicia such as temperature, refractive index, reflectivity, emmisivity, etc. In some embodiments, the second control point may only be identified based on a function of a plurality of measurements of such indicia. In some embodiments, the function may be a first order derivative of the plurality of measurements of such indicia with respect to time. In some embodiments, the function may be a second order derivative of the plurality of measurements of such indicia with respect to time.

It is not necessary that all critical control points have to be identified and utilized. In some embodiments, only one critical control point is identified and utilized to control the fabrication quality of a CIGS semiconductor layer. In some embodiments, more than one critical control point is identified and utilized to control the fabrication quality of a CIGS semiconductor layer.

Step 220. At step 220, the co-evaporation of In and Ga is terminated. In some embodiments, the fabrication of a CIGS semiconductor layer is complete at this stage. In some embodiments, the fabrication of CIGS semiconductor layer is not complete until one or more additional layers are deposed onto the CIGS.

4.3 Exemplary Photovoltaic Modules

The systems and methods disclosed in the present application can be used in the manufacture of both thin film and thick film solar cells 12. In some embodiments, the methods can be used in the fabrication of monolithically integrated solar cells 12 of a photovoltaic module 300 as depicted in FIGS. 3C and 4, in which cuts 280 in a substrate 102 define the boundaries of solar cells 12 in a photovoltaic module 300. Monolithically integrated solar cells 12 have the advantage of reducing current carrying requirements of the integrated solar cells 12. Sufficient monolithic integration, therefore, substantially reduces electrode, transparent conductor, and counter-electrode current carrying requirements, thereby minimizing material costs. Examples of monolithically integrated solar cells are found in U.S. Pat. No. 7,235,736 entitled "Monolithic integration of cylindrical solar cells," which is hereby incorporated by reference herein in its entirety.

4.3.1 Multi-Component Semiconductor Junction Layers

Figure 3A:
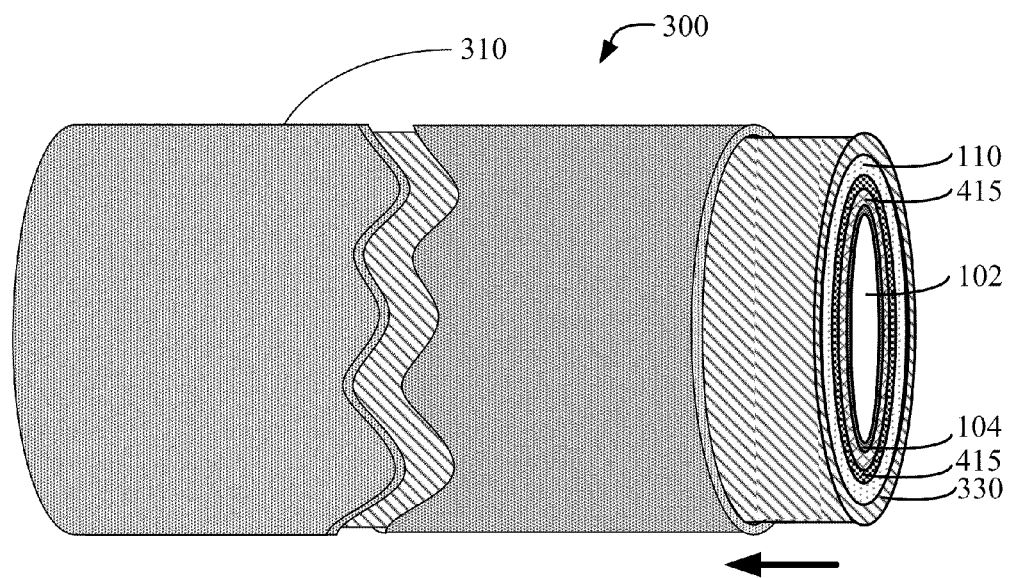
FIGS. 3A-3C depict an exemplary solar cell manufactured in accordance with the present application.
Figure 3B:
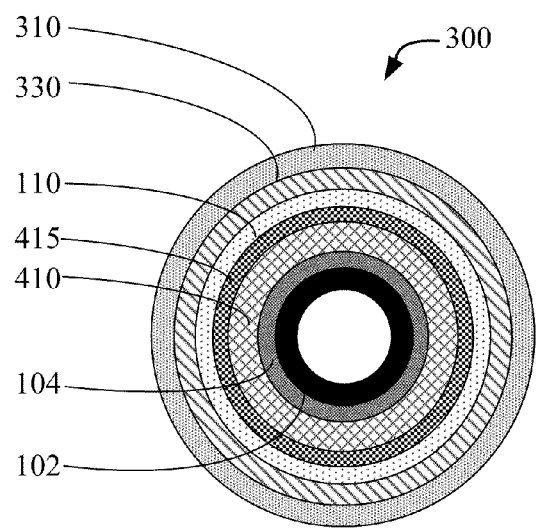
Figure 3C:
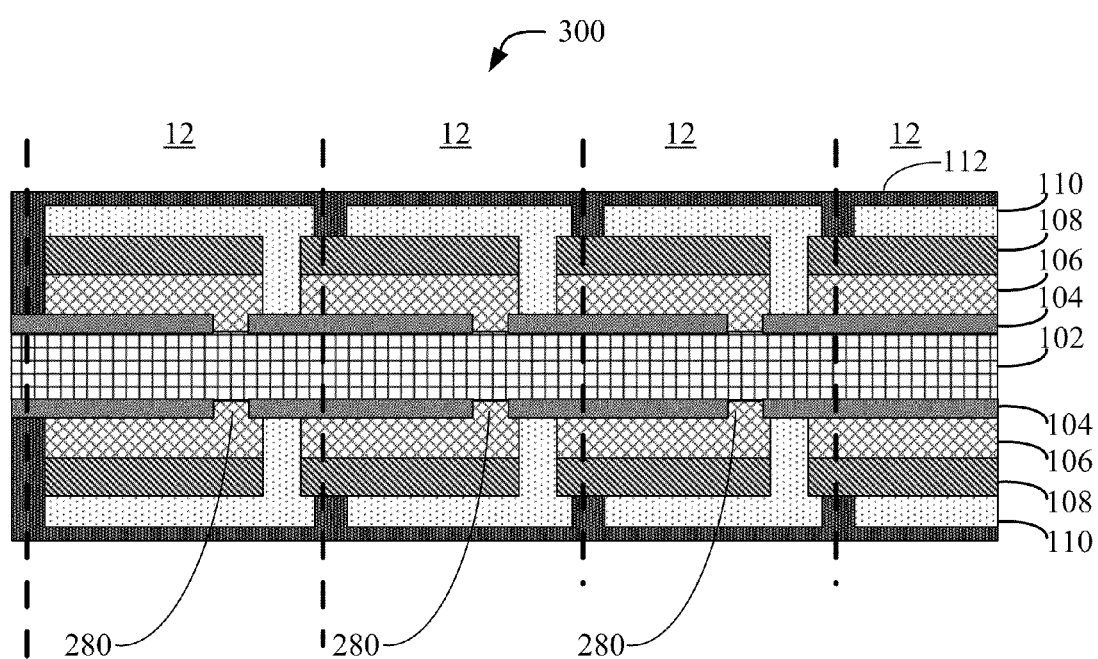
Figure 4:
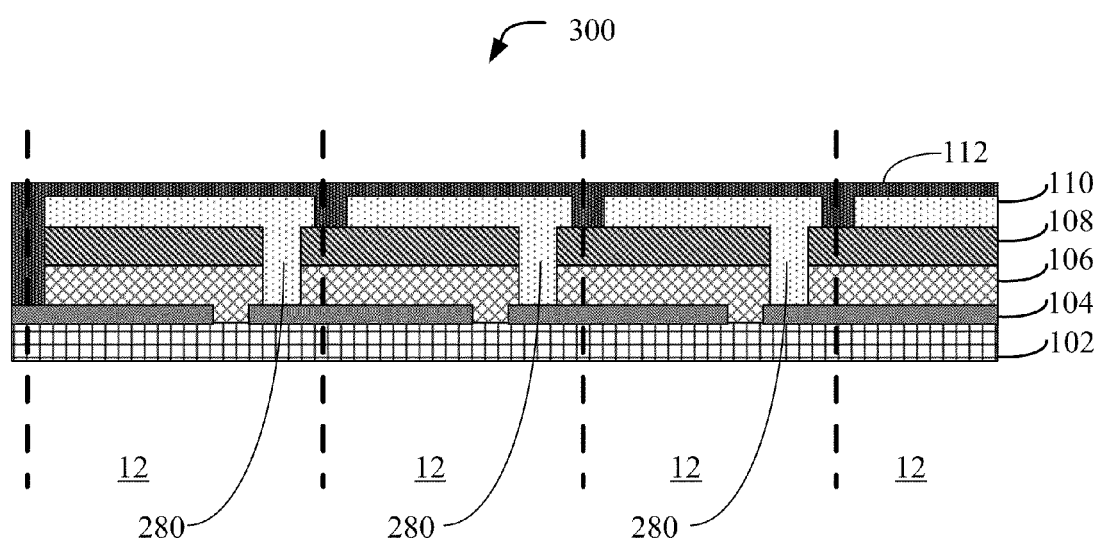
FIG. 4 depicts an exemplary solar cell manufactured in accordance with the present application.

As illustrated in FIGS. 3A-3C, in some embodiments, the photovoltaic module 300 is cylindrical. As used herein, the term cylindrical means objects having a cylindrical or approximately cylindrical shape. In fact, cylindrical objects can have irregular shapes so long as the object, taken as a whole, is roughly cylindrical. Such cylindrical shapes can be solid (e.g., a rod) or hollowed (e.g., a tube). As used herein, the term tubular means objects having a tubular or approximately tubular shape. In fact, tubular objects can have irregular shapes so long as the object, taken as a whole, is roughly tubular.

Although the present application discloses photovoltaic modules 300 in the context of either encapsulated embodiments or circumferentially covered embodiments, it is to be appreciated that such embodiments serve as no limitation to the scope of the present application. In some embodiments, there is no transparent casing 310. In some embodiments, any transparent tubular casing that provides support and protection to the photovoltaic module and permits electrical connections between the photovoltaic modules are within the scope of the systems and methods of the present application. More detailed descriptions of exemplary photovoltaic modules is provided below in accordance with FIGS. 3A and 3B.

The substrate 102. A substrate 102 serves as a substrate for one or more solar cells 12. In some embodiments, the substrate 102 is made of a plastic, metal, metal alloy, or glass. In some embodiments, as illustrated in FIG. 3A, the substrate 102 is cylindrical shaped. In some embodiments, the substrate 102 has a hollow core, as illustrated in FIG. 3B. In some embodiments, the substrate 102 has a solid core. In some embodiments, the shape of the substrate 102 is only approximately that of a cylindrical object, meaning that a cross-section taken at a right angle to the long axis of the substrate 102 defines an ellipse rather than a circle. As the term is used herein, such approximately shaped objects are still considered cylindrically shaped in the present application. In some embodiments, the substrate 102 supports one or more solar cells 12 arranged in a bifacial, multi-facial, or omnifacial manner. Thus, in some embodiments, the substrate 102 is flat planar while in other embodiments the substrate 102 is non-planar. In some embodiments, the substrate 102 is optically transparent to wavelengths that are generally absorbed by the semiconductor junction of a solar cell of the photovoltaic module. In some embodiments, the substrate 102 is not optically transparent. More details on suitable substrates 102 are disclosed in Section 4.5 below.

The back-electrode 104. A back-electrode 104 is disposed on the substrate 102. The back-electrode 104 serves as the first electrode in the solar cells of a photovoltaic module. In general, the back-electrode 104 is made out of any material such that it can support a photovoltaic current with negligible resistive losses. In some embodiments, the back-electrode 104 is composed of any conductive material, such as aluminum, molybdenum, tungsten, vanadium, rhodium, niobium, chromium, tantalum, titanium, steel, nickel, platinum, silver, gold, an alloy thereof (e.g. KOVAR), or any combination thereof. In some embodiments, the back-electrode 104 is composed of any conductive material, such as indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic. As defined herein, a conductive plastic is one that, through compounding techniques, contains conductive fillers which, in turn, impart their conductive properties to the plastic. In some embodiments, the conductive plastics used in the present application to form the back-electrode 104 contain fillers that form sufficient conductive current-carrying paths through the plastic matrix to support a photovoltaic current with negligible resistive losses. The plastic matrix of the conductive plastic is typically insulating, but the composite produced exhibits the conductive properties of the filler.

The semiconductor junction 410. A semiconductor junction 410 is formed on the back-electrode 104. Examples of such semiconductor junctions are described in Chapter 1 of Bube, *Photovoltaic Materials*, 1998, Imperial College Press, London, as well as Lugue and Hegedus, 2003, *Handbook of Photovoltaic Science and Engineering*, John Wiley & Sons, Ltd., West Sussex, England, each of which is hereby incorporated by reference herein in its entirety. In some embodiments, the semiconductor junction 410 can be a multijunction comprising multiple junctions that, preferably, have successfully smaller band gaps. In some embodiments, the semiconductor junction 410 may be formed by a Group IB, Group IIB, Group IIIA, Group VIA element, or a combination thereof. In some embodiments, the semiconductor junction 410 may further comprise additional dopants to expand its band-gap to maximize absorption of solar radiation. In some embodiments, the semiconductor junction 410 includes a copper-indium-gallium-diselenide (CIGS) absorber layer. In some embodiments, the semiconductor junction 410 includes a copper-indium-diselenide (CIS) absorber layer. In some embodiments, the semiconductor junction 410 includes a copper-gallium-diselenide (CGS) absorber layer. In some embodiments, the semiconductor junction 410 further comprises Al, Tl, As, Te, Se, S, Cd, Zn, Cu, Ti, or any suitable element or compound.

Optional intrinsic layer 415. Optionally, there is a thin intrinsic layer (i-layer) 415 disposed on the semiconductor junction 410. The i-layer 415 can be formed using any undoped transparent oxide including, but not limited to, zinc oxide, metal oxide, or any transparent material that is highly insulating. In some embodiments, the i-layer 415 is highly pure zinc oxide.

The transparent conductive layer 110. In some embodiments, a transparent conductive layer 110 is disposed on the semiconductor junction layer 410 thereby completing the circuit. As noted above, in some embodiments, a thin i-layer 415 is disposed on the semiconductor junction 410. In such embodiments, the transparent conductive layer 110 is disposed on the i-layer 415. In some embodiments, the transparent conductive layer 110 is made of tin oxide $SnO_x$ (with or without fluorine doping), indium-tin oxide (ITO), doped zinc oxide (e.g., aluminum doped zinc oxide, gallium doped zinc oxide, boron dope zinc oxide), indium-zinc oxide or any combination thereof. In some embodiments, the transparent conductive layer 110 is either p-doped or n-doped. In some embodiments, the transparent conductive layer is made of carbon nanotubes. Carbon nanotubes are commercially available, for example from Eikos (Franklin, Mass.) and are described in U.S. Pat. No. 6,988,925, which is hereby incorporated by reference herein in its entirety. For example, in embodiments where the outer semiconductor layer of junction 410 is p-doped, the transparent conductive layer 110 can be p-doped. Likewise, in embodiments where the outer semiconductor layer of junction 410 is n-doped, the transparent conductive layer 110 can be n-doped. In general, the transparent conductive layer 110 is preferably made of a material that has very low resistance, suitable optical transmission properties (e.g., greater than 90%), and a deposition temperature that will not damage underlying layers of the semiconductor junction 410 and/or the optional i-layer 415. In some embodiments, the transparent conductive layer 110 is an electrically conductive polymer material such as a conductive polytiophene, a conductive polyaniline, a conductive polypyrrole, a PSS-doped PEDOT (e.g., BAYRTON), or a derivative of any of the foregoing. In some embodiments, the transparent conductive layer 110 comprises more than one layer, including a first layer comprising tin oxide $SnO_x$ (with or without fluorine doping), indium-tin oxide (ITO), indium-zinc oxide, doped zinc oxide (e.g., aluminum doped zinc oxide, gallium doped zinc oxide, boron dope zinc oxide) or a combination thereof and a second layer comprising a conductive polytiophene, a conductive polyaniline, a conductive polypyrrole, a PSS-doped PEDOT (e.g., Bayrton), or a derivative of any of the foregoing. Additional suitable materials that can be used to form transparent conductive layer are disclosed in U.S. Patent publication 2004/0187917A1 to Pichler, which is hereby incorporated by reference herein in its entirety.

Optional filler layer 330. In some embodiments of the present application, as depicted in FIG. 3B, a filler layer 330 of sealant such as ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, and/or a urethane is coated over transparent conductive layer 110 to seal out air and, optionally, to provide complementary fitting to a transparent tubular casing 310. In some embodiments, the filler layer 330 is a Q-type silicone, a silsesquioxane, a D-type silicon, or an M-type silicon. However, in some embodiments, optional filler layer 330 is not needed. In some embodiments, the filler layer 330 is laced with a desiccant such as calcium oxide or barium oxide. In some embodiments, the optical layer 330 is a composition described in U.S. patent application Ser. No. 11/544,333, filed Oct. 6, 2006, which is hereby incorporated by reference herein in its entirety.

Optional transparent casing 310. In some embodiments, photovoltaic modules 300 are optionally encased by a transparent casing 310. In some embodiments, only one end of the photovoltaic module 300 is exposed by the transparent tubular casing 310 in order to form an electrical connection with adjacent circuitry or photovoltaic modules. In some embodiments, both ends of the photovoltaic module 300 are exposed by the transparent tubular casing 310 in order to form an electrical connection with circuitry or photovoltaic modules. Optional transparent casing 310 is disposed on the transparent conductive layer 110 and/or the optional filler layer 330. More description of the optional transparent tubular casing 310 is found in Section 4.4.

Optional water resistant layer. In some embodiments, one or more layers of water resistant layer are provided to prevent exposure to water. In some embodiments, this water resistant layer is disposed onto the transparent conductive layer 110 prior to depositing the optional filler layer 330 and encasing the photovoltaic module 300 the in transparent tubular casing 310. In some embodiments, one or more such water resistant layers are disposed onto the optional filler layer 330 prior to encasing the photovoltaic module 300 in the transparent tubular casing 310. In some embodiments, such water resistant layers are disposed onto the transparent tubular casing 310 itself. In embodiments where a water resistant layer is provided to seal water from the photovoltaic module, it is preferable that the optical properties of the water resistant layer not interfere with the absorption of incident solar radiation by the photovoltaic module. In some embodiments, this water resistant layer is made of clear silicone, SiN, $SiO_xN_y$, $SiO_x$, or $Al_2O_3$, where x and y are integers. In some embodiments, the optional water resistant layer is made of a Q-type silicone, a silsesquioxane, a D-type silicon, or an M-type silicon.

Optional antireflective coating. In some embodiments, an optional antireflective coating is disposed on the transparent casing 310 to maximize solar cell efficiency. In some embodiments, there is a both a water resistant layer and an antireflective coating deposited on the transparent casing 310. In some embodiments, a single layer serves the dual purpose of a water resistant layer and an anti-reflective coating. In some embodiments the antireflective coating is made of $MgF_2$, silicone nitrate, titanium nitrate, silicon monoxide (SiO), or silicon oxide nitrite. In some embodiments, there is more than one layer of antireflective coating. In some embodiments, there is more than one layer of antireflective coating and each layer is made of the same material. In some embodiments, there is more than one layer of antireflective coating and each layer is made of a different material.

Optional fluorescent material. In some embodiments, a fluorescent material (e.g., luminescent material, phosphorescent material) is coated on a surface of a layer of photovoltaic module 300. In some embodiments, the fluorescent material is coated on the luminal surface and/or the exterior surface of the transparent casing 310. In some embodiments, the fluorescent material is coated on the outside surface of transparent conductive layer 110. In some embodiments, the photovoltaic module 300 includes an optional filler layer 300 and the fluorescent material is coated on the optional filler layer. In some embodiments, photovoltaic module 300 includes a water resistant layer and the fluorescent material is coated on the water resistant layer. In some embodiments, more than one surface of a photovoltaic module 300 is coated with optional fluorescent material. In some embodiments, the fluorescent material absorbs blue and/or ultraviolet light, which some semiconductor junctions 410 of the present application do not use to convert to electricity, and the fluorescent material emits light in visible and/or infrared light which is useful for electrical generation in some photovoltaic modules 300 of the present application.

Fluorescent, luminescent, or phosphorescent materials can absorb light in the blue or UV range and emit visible light. Phosphorescent materials, or phosphors, usually comprise a suitable host material and an activator material. The host materials are typically oxides, sulfides, selenides, halides or silicates of zinc, cadmium, manganese, aluminum, silicon, or various rare earth metals. The activators are added to prolong the emission time.

In some embodiments, phosphorescent materials are incorporated in the systems and methods of the present application to enhance light absorption by photovoltaic module 300. In some embodiments, the phosphorescent material is directly added to the material used to make optional transparent casing 310. In some embodiments, the phosphorescent materials are mixed with a binder for use as transparent paints to coat various outer or inner layers of photovoltaic module 300, as described above.

Exemplary phosphors include, but are not limited to, copper-activated zinc sulfide (ZnS:Cu) and silver-activated zinc sulfide (ZnS:Ag). Other exemplary phosphorescent materials include, but are not limited to, zinc sulfide and cadmium sulfide (ZnS:CdS), strontium aluminate activated by europium ($SrAlO_3$:Eu), strontium titanium activated by praseodymium and aluminum (SrTiO3:Pr, Al), calcium sulfide with strontium sulfide with bismuth ((Ca,Sr)S:Bi), copper and magnesium activated zinc sulfide (ZnS:Cu,Mg), or any combination thereof.

Methods for creating phosphor materials are known in the art. For example, methods of making ZnS:Cu or other related phosphorescent materials are described in U.S. Pat. Nos. 2,807,587 to Butler et al.; 3,031,415 to Morrison et al.; 3,031,416 to Morrison et al.; 3,152,995 to Strock; 3,154,712 to Payne; 3,222,214 to Lagos et al.; 3,657,142 to Poss; 4,859,361 to Reilly et al., and 5,269,966 to Karam et al., each of which is hereby incorporated by reference herein in its entirety. Methods for making ZnS:Ag or related phosphorescent materials are described in U.S. Pat. Nos. 6,200,497 to Park et al., 6,025,675 to Ihara et al.; 4,804,882 to Takahara et al., and 4,512,912 to Matsuda et al., each of which is hereby incorporated by reference herein in its entirety. Generally, the persistence of the phosphor increases as the wavelength decreases. In some embodiments, quantum dots of CdSe or similar phosphorescent material can be used to get the same effects. See Dabbousi et al., 1995, "Electroluminescence from CdSe quantum-dot/polymer composites," Applied Physics Letters 66 (11): 1316-1318; Dabbousi et al., 1997 "(CdSe)ZnS Core-Shell Quantum Dots: Synthesis and Characterization of a Size Series of Highly Luminescent Nanocrystallites," J. Phys. Chem. B, 101: 9463-9475; Ebenstein et al., 2002, "Fluorescence quantum yield of CdSe:ZnS nanocrystals investigated by correlated atomic-force and single-particle fluorescence microscopy," Applied Physics Letters 80: 4033-4035; and Peng et al., 2000, "Shape control of CdSe nanocrystals," Nature 404: 59-61; each of which is hereby incorporated by reference herein in its entirety.

In some embodiments, optical brighteners are used in the optional fluorescent layers of the present application. Optical brighteners (also known as optical brightening agents, fluorescent brightening agents or fluorescent whitening agents) are dyes that absorb light in the ultraviolet and violet region of the electromagnetic spectrum, and re-emit light in the blue region. Such compounds include stilbenes (e.g., trans-1,2-diphenylethylene or (E)-1,2-diphenylethene). Another exemplary optical brightener that can be used in the optional fluorescent layers of the present application is umbelliferone (7-hydroxycoumarin), which also absorbs energy in the UV portion of the spectrum. This energy is then re-emitted in the blue portion of the visible spectrum. More information on optical brighteners is in Dean, 1963, *Naturally Occurring Oxygen Ring Compounds*, Butterworths, London; Joule and Mills, 2000, *Heterocyclic Chemistry*, 4$^{th}$ edition, Blackwell Science, Oxford, United Kingdom; and Barton, 1999, *Comprehensive Natural Products Chemistry* 2: 677, Nakanishi and Meth-Cohn eds., Elsevier, Oxford, United Kingdom, 1999.

Circumferentially disposed. In some embodiments, layers of material are successively circumferentially disposed on a substrate 102 that is cylindrical in order to form a photovoltaic module. As used herein, the term circumferentially disposed is not intended to imply that each such layer of material is necessarily deposited on an underlying layer. In fact, the present application teaches methods by which such layers are molded or otherwise formed on an underlying layer. Nevertheless, the term circumferentially disposed means that an overlying layer is disposed on an underlying layer such that there is no annular space between the overlying layer and the underlying layer. Furthermore, as used herein, the term circumferentially disposed means that an overlying layer is disposed on at least fifty percent of the perimeter of the underlying layer. Furthermore, as used herein, the term circumferentially disposed means that an overlying layer is disposed along at least half of the length of the underlying layer.

Circumferentially sealed. The term circumferentially sealed is not intended to imply that an overlying layer or structure is necessarily deposited on an underlying layer or structure. In fact, the present application teaches methods by which such layers or structures (e.g., transparent casing 310) are molded or otherwise formed on an underlying layer or structure. Nevertheless, the term circumferentially sealed means that an overlying layer or structure is disposed on an underlying layer or structure such that there is no annular space between the overlying layer or structure and the underlying layer or structure. Furthermore, as used herein, the term circumferentially sealed means that an overlying layer is disposed on the full perimeter of the underlying layer. In typical embodiments, a layer or structure circumferentially seals an underlying layer or structure when it is circumferentially disposed around the full perimeter of the underlying layer or structure and along the full length of the underlying layer or structure. However, the present application contemplates embodiments in which a circumferentially sealing layer or structure does not extend along the full length of an underlying layer or structure.

Rigid. In some embodiments, the substrate 102 is rigid. Rigidity of a material can be measured using several different metrics including, but not limited to, Young's modulus. In solid mechanics, Young's Modulus (E) (also known as the Young Modulus, modulus of elasticity, elastic modulus or tensile modulus) is a measure of the stiffness of a given material. It is defined as the ratio, for small strains, of the rate of change of stress with strain. This can be experimentally determined from the slope of a stress-strain curve created during tensile tests conducted on a sample of the material. Young's modulus for various materials is given in the following table.

| Material | Young's modulus (E) in GPa | Young's modulus (E) in lbf/in$^2$ (psi) |
|---|---|---|
| Rubber (small strain) | 0.01-0.1 | 1,500-15,000 |
| Low density polyethylene | 0.2 | 30,000 |
| Polypropylene | 1.5-2 | 217,000-290,000 |
| Polyethylene terephthalate | 2-2.5 | 290,000-360,000 |
| Polystyrene | 3-3.5 | 435,000-505,000 |
| Nylon | 3-7 | 290,000-580,000 |
| Aluminum alloy | 69 | 10,000,000 |
| Glass (all types) | 72 | 10,400,000 |

-continued

| Material | Young's modulus (E) in GPa | Young's modulus (E) in lbf/in² (psi) |
|---|---|---|
| Brass and bronze | 103-124 | 17,000,000 |
| Titanium (Ti) | 105-120 | 15,000,000-17,500,000 |
| Carbon fiber reinforced plastic (unidirectional, along grain) | 150 | 21,800,000 |
| Wrought iron and steel | 190-210 | 30,000,000 |
| Tungsten (W) | 400-410 | 58,000,000-59,500,000 |
| Silicon carbide (SiC) | 450 | 65,000,000 |
| Tungsten carbide (WC) | 450-650 | 65,000,000-94,000,000 |
| Single Carbon nanotube | 1,000+ | 145,000,000 |
| Diamond (C) | 1,050-1,200 | 150,000,000-175,000,000 |

In some embodiments of the present application, a material (e.g., substrate 102) is deemed to be rigid when it is made of a material that has a Young's modulus of 20 GPa or greater, 30 GPa or greater, 40 GPa or greater, 50 GPa or greater, 60 GPa or greater, or 70 GPa or greater. In some embodiments of the present application a material (e.g., the substrate 102) is deemed to be rigid when the Young's modulus for the material is a constant over a range of strains. Such materials are called linear, and are said to obey Hooke's law. Thus, in some embodiments, the substrate 102 is made out of a linear material that obeys Hooke's law. Examples of linear materials include, but are not limited to, steel, carbon fiber, and glass. Rubber and soil (except at very low strains) are non-linear materials.

Exemplary dimensions and electrical configurations. In some embodiments, the photovoltaic module is cylindrical and has a cross-section that has a diameter of between 1 micron and $1\times10^{12}$ microns, a diameter of greater than $1\times10^6$ microns, a diameter of greater than $1\times10^7$ microns, a diameter of greater than $1\times10^8$ microns, a diameter of greater than $1\times10^9$ microns, a diameter of greater than $1\times10^{10}$ microns, a diameter of greater than $1\times10^{11}$ microns, a diameter of greater than $1\times10^{12}$ microns, or a diameter of greater than $1\times10^{13}$ microns.

In some embodiments, the photovoltaic modules 300, for example, those depicted in FIG. 3, are arranged in parallel rows to form a planar assembly. The photovoltaic modules 300 may be electrically connected in series or parallel. In some embodiments, some photovoltaic modules 300 in the assembly are electrically arranged in series and some are electrically arranged in parallel. In some embodiments, some photovoltaic modules 300 are directly contacting other photovoltaic modules 300 in the assembly. In some embodiments, each photovoltaic module 300 is spaced at least 1 micron, at least 2 microns, at least 3 microns, at least 4 microns, at least 5 microns, at least 100 microns, at least 500 microns away from neighboring photovoltaic modules 300. In some such embodiments, photovoltaic modules 300 in the assembly are electrically isolated from neighboring photovoltaic modules in the assembly.

In some embodiments, the photovoltaic modules 300 have a length of between 0.5 microns and $1\times10^{18}$ microns, between 0.5 microns and $1\times10^{17}$ microns, between 0.5 microns and $1\times10^{16}$ microns, between 0.5 microns and $1\times10^{15}$ microns, between 0.5 microns and $1\times10^{14}$ microns, between 0.5 microns and $1\times10^{13}$ microns, between 0.5 microns and $1\times10^{12}$ microns, between 0.5 microns and $1\times10^{11}$ microns, between 0.5 microns and $1\times10^{10}$ microns, between 0.5 microns and $1\times10^9$ microns, between 0.5 microns and $1\times10^8$ microns, between 0.5 microns and $1\times10^7$ microns, between 0.5 microns and $1\times10^6$ microns, between 0.5 microns and $1\times10^5$ microns, between 0.5 microns and $1\times10^4$ microns, between 0.5 microns and $1\times10^3$ microns, between 0.5 microns and $1\times10^2$ microns, between 0.5 microns and 10 microns, or between 0.5 microns and $1\times1$ micron. In some embodiments, each photovoltaic module 300 in an assembly has the same length. In some embodiments, each photovoltaic module 300 can have the same length or different length than other photovoltaic modules 300 in the assembly.

In some embodiments, the substrate 102 has a width dimension and a longitudinal dimension. In some embodiments, the longitudinal dimension of the substrate 102 is at least four times greater than the width dimension. In other embodiments, the longitudinal dimension of the substrate 102 is at least five times greater than the width dimension. In yet other embodiments, the longitudinal dimension of the substrate 102 is at least six times greater than the width dimension. In some embodiments, the longitudinal dimension of the substrate 102 is 10 cm or greater. In other embodiments, the longitudinal dimension of the substrate 102 is 50 cm or greater. In some embodiments, the width dimension of the substrate 102 is 1 cm or greater. In other embodiments, the width dimension of the substrate 102 is 5 cm or greater. In yet other embodiments, the width dimension of the elongated substrate 102 is 10 cm or greater.

4.3.2 Multi-Component Semiconductor Junction Layers on Non-cylindrical Substrates Any of the aforementioned layers may be constructed on a substrate 102 that is planar. As depicted in FIG. 4, a series of solar cells 12 are monolithically connected on a substrate 102 that is planar to collectively form a photovoltaic module 300. Variations on different layers of a photovoltaic module 300 (e.g., as depicted in FIG. 3C) also apply to the photovoltaic module 300 depicted in FIG. 4. More description of such monolithic configurations is described, for example, in U.S. Pat. No. 7,235,736 which is hereby incorporated by reference herein in its entirety.

4.4 Additional Exemplary Embodiments with Transparent Tubular Casings

A transparent tubular casing 310, as depicted in FIGS. 3A and 3B, seals a photovoltaic module 300 to provide support and protection to the device. The size and dimensions of the transparent casing 310 are determined by the size and dimension of individual solar cells 12 in a photovoltaic module 300. The transparent casing 310 may be made of glass, plastic or any other suitable material. Examples of materials that can be used to make the transparent casing 310 include, but are not limited to, glass (e.g., soda lime glass), acrylics such as polymethylmethacrylate, polycarbonate, fluoropolymer (e.g., TEFZEL or TEFLON), polyethylene terephthalate (PET), TEDLAR, or some other suitable transparent material.

In some embodiments, optional casing 310 is made of plastic or glass. Referring to FIG. 3, in some embodiments, photovoltaic modules are sealed in the transparent casing 310. The transparent casing 310 fits over the outermost layers of the solar cells in the photovoltaic module 300. In some embodiments, the transparent casing 310 is made of a urethane polymer, an acrylic polymer, polymethylmethacrylate (PMMA), a fluoropolymer, silicone, poly-dimethyl siloxane (PDMS), silicone gel, epoxy, ethyl vinyl acetate (EVA), perfluoroalkoxy fluorocarbon (PFA), nylon/polyamide, cross-linked polyethylene (PEX), polyolefin, polypropylene (PP), polyethylene terephthalate glycol (PETG), polytetrafluoroethylene (PTFE), thermoplastic copolymer (for example, ETFE®, which is a derived from the polymerization of ethylene and tetrafluoroethylene: TEFLON® monomers), polyurethane/urethane, polyvinyl chloride (PVC), polyvinylidene fluoride (PVDF), Tygon®, vinyl, Viton®, or any combination or variation thereof.

In some embodiments, the transparent casing 310 comprises a plurality of transparent casing layers. In some embodiments, each transparent casing is composed of a different material. For example, in some embodiments, the transparent casing 310 comprises a first transparent casing layer and a second transparent casing layer. Depending on the exact configuration of the photovoltaic module, the first transparent casing layer is disposed on the transparent conductive layer 110, optional filler layer 330 or the water resistant layer. The second transparent casing layer is disposed on the first transparent casing layer.

In some embodiments, each transparent casing layer has a different property. In one example, the outer transparent tubular layer has excellent UV shielding properties whereas the inner transparent casing layer has good water proofing characteristics. Moreover, the use of multiple transparent casing layers can be used to reduce costs and/or improve the overall properties of transparent casing 310. For example, one transparent casing layer may be made of an expensive material that has a desired physical property. By using one or more additional transparent casing layers, the thickness of the expensive transparent casing layer may be reduced, thereby achieving a savings in material costs. In another example, one transparent casing layer may have excellent optical properties (e.g., index of refraction, etc.) but be very heavy. By using one or more additional transparent casing layers, the thickness of the heavy transparent casing layer may be reduced, thereby reducing the overall weight of transparent casing 310. Additional exemplary materials that can be used to make the transparent casing as well as exemplary physical properties of the transparent casing 310 are found in U.S. patent application Ser. No. 11/378,847, filed Mar. 18, 2006, which is hereby incorporated by reference herein for such purpose.

4.5 Exemplary Substrates

In some embodiments, the substrate 102 is either (i) tubular shaped or (ii) a rigid solid rod shaped. In some embodiments the substrate 102 is any solid cylindrical shape or hollowed cylindrical shape. In some embodiments, the substrate 102 has a diameter of 0.1 microns or larger, 0.4 microns or larger, 0.8 microns or larger, 1 micron or larger, 2 microns or larger, 10 microns or larger, 100 microns or larger, 1000 microns or larger $1 \times 10^4$ microns or larger, $1 \times 10^5$ microns or larger, or $1 \times 10^6$ microns or larger. When the substrate 102 is tubular shaped it can be either rigid or flexible. For example, in some embodiments, the substrate 102 is a hollow flexible fiber. In some embodiments, the substrate 102 is a rigid tube made out plastic metal or glass. In some embodiments, the substrate 102 is made of a plastic, metal, metal alloy, or glass. In some embodiments, the substrate 102 is made of a urethane polymer, an acrylic polymer, a fluoropolymer, polybenzimidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene. In some embodiments, the substrate 102 is made of aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass. Additional exemplary materials that can be used to make the substrate are found in U.S. patent application Ser. No. 11/378,847, filed Mar. 18, 2006, which is hereby incorporated by reference herein for such purpose.

4.6 Exemplary Embodiments

One aspect of the application provides a method of manufacturing as semiconductor layer comprising. In the method at least one Group IIIA element and at least one Group VIA element are deposited (first depositing step), during a first period of time, on a substrate or on an optional layer that is optionally disposed on the substrate. Then, at least one Group IB element and the at least one group VIA element are deposited (second depositing step), during a second period of time, on the substrate or on an optional layer that is optionally disposed on the substrate. At least a portion of the at least one Group IB element combines with the at least one Group VIA element to form a $IB_2VIA$ composition. A first deposition state is monitored during the second depositing step by making a first plurality of measurements of an indicia of the first deposition state. The second depositing step is terminated or attenuated at a first critical control point based on a function of the first plurality of measurements of the indicia of the first deposition state. Then, at least one additional Group IIIA element and the at least one Group VIA element are deposited (third depositing step), during a third period of time. A second deposition state is monitored during the third depositing step by making a second plurality of measurements of an indicia of the second deposition state. The third depositing step is terminated or attenuated at a second critical control point based on a function of the second plurality of measurements of the indicia of the second deposition state.

In some embodiments, the at least one Group IIIA element comprises Gallium (Ga), Indium (In), Aluminum (Al), or Thallium (Tl). In some embodiments, the at least one Group VIA element comprises Sulfur (S), Selenium (Se), Tellurium (Te), or Polonium (Po). In some embodiments, the at least one Group IB element comprises Copper (Cu), Silver (Ag), or Gold (Au). In some embodiments, the semiconductor layer comprises $CuIn_{1-x}Ga_xSe_2$, $0 \leq x \leq 1$. In some embodiments, the semiconductor layer comprises $CuIn_{1-x}Ga_x(Se_yS_{1-y})_2$, where $0 \leq x$, $y \leq 1$. In some embodiments, the substrate is cylindrical. In some embodiments, the substrate is planar.

In some embodiments, the first period of time is between 15 minutes and 60 minutes. In some embodiments, the second period of time is between 15 minutes and 60 minutes. In some embodiments, the third period of time is between 15 minutes and 60 minutes. In some embodiments, there is a time gap between the first depositing step and the second depositing step. In some embodiments, a precursor is formed on the substrate or the optional layer on the substrate during at least a portion of the time gap. During the time gap, no material is deposited on the substrate or on the optional layer(s) optionally disposed on the substrate. In some embodiments, a precursor is formed by the at least one Group IIIA element and the at least one Group VIA element during at least a portion of the time gap.

In some embodiments, the function of the first plurality of measurements of the indicia of the first deposition state is a second order derivative, with respect to time, of the first plurality of measurements. In some embodiments, the first critical control point occurs when the second order derivative, with respect to time, approaches a threshold value. In some embodiments, the threshold value is zero. In some embodiments, the function of the second plurality of measurements of the indicia of the second deposition state is a second order derivative, with respect to time, of the second plurality of measurements. In some embodiments, the second critical control point occurs when the second order derivative, with respect to time, approaches a threshold value. In some embodiments, the threshold value is zero.

In some embodiments, the $IB_2VIA$ composition is $Cu_2Se$. In some embodiments, the indicia of the first deposition state is a temperature of the substrate or the optional layer on the substrate, a refractive index of the substrate or the optional layer on the substrate, or a vapor pressure. In some embodiments, the indicia of the second deposition state is a temperature of the substrate or the optional layer on the substrate, a refractive index of the substrate or the optional layer on the substrate, or a vapor pressure. In some embodiments, the indicia of the first deposition state and the indicia of the second deposition state are the same. In some embodiments, the indicia of the first deposition state and the indicia of the second deposition state are different.

In some embodiments, the function of the first plurality of measurements of the indicia of the first deposition state is a first order derivative, with respect to time, of the first plurality of measurements of the indicia of the first deposition state. In some embodiments, the first critical control point occurs when the first order derivative, with respect to time, falls below a threshold value. In some embodiments, the first order derivative, with respect to time, falls below the threshold value when the first order derivative achieves a minimum value. In some embodiments, the first critical control point occurs when the first order derivative, with respect to time, rises above a threshold value. In some embodiments, the first order derivative, with respect to time, rises above the threshold value when the first order derivative achieves a maximum value. In some embodiments, the function of the second plurality of measurements of the indicia of the second deposition state is a first order derivative, with respect to time, of the second plurality of measurements of the indicia of the second deposition state.

In some embodiments, the second critical control point occurs when the first order derivative, with respect to time, falls below a threshold value. In some embodiments, the first order derivative, with respect to time, falls below the threshold value when the first order derivative achieves a minimum value. In some embodiments, the second critical control point occurs when the first order derivative, with respect to time, rises above a threshold value. In some embodiments, the first order derivative, with respect to time, rises above the threshold value when the first order derivative, with respect to time, achieves a maximum value. In some embodiments, the at least one Group IIIA element and the at least one Group VIA element form a precursor $IIIA_2VIA_3$ composition on the substrate or the optional layer on the substrate. In some embodiments, the precursor $IIIA_2VIA_3$ composition is $(In_xGa_{1-x})_2(Se_yS_{1-y})_3$, where $0 \leq x$, and $y \leq 1$. In some embodiments, the precursor $IIIA_2VIA_3$ composition is $(In_xGa_{1-x})_2Se_3$, where $0 \leq x \leq 1$. In some embodiments the optional layer is disposed on the substrate. In some embodiments, the optional layer is a back-electrode. In some embodiments, the optional layer is not disposed on the substrate and the i) depositing step i) deposits at least one Group IIIA element and at least one Group VIA element on the substrate.

Another aspect of the application provides a system for monitoring and controlling a deposition process. The system comprises means for depositing at least three elements on a substrate or an optional layer disposed on the substrate, where the deposition of one of the at least three elements is controlled by the means for depositing, and where the at least three elements comprises at least one Group IIIA element and at least one Group VIA element. The system further comprises a monitoring unit for retrieving a plurality of measurements of at least one indicia reflecting a deposition state of one or more of the at least three elements, where the monitoring unit is configured to compute a first derivative or a second derivative, with respect to time, of all or a portion of the plurality of measurements. The system further comprises a controlling unit for adjusting the deposition of one of the at least three elements based on a result computed by the monitoring unit.

Another aspect of the application provides a photovoltaic module comprising a substrate and a plurality of solar cells linearly arranged on the substrate. The plurality of solar cells comprises a first solar cell and a second solar cell. Each solar cell in the plurality of solar cells comprises (i) a back-electrode disposed on the substrate, (ii) a semiconductor junction layer disposed on the back-electrode, (iii) and a transparent conductive layer disposed on the semiconductor junction. The transparent conductive layer of the first solar cell in the plurality of solar cells is in serial electrical communication with the back-electrode of the second solar cell in the plurality of solar cells. A layer of the semiconductor junction layer is constructed by i) depositing, during a first period of time, at least one Group IIIA element and at least one Group VIA element on the back-electrode, ii) depositing, during a second period of time, at least one Group IB element and the at least one group VIA element, where at least a portion of the at least one Group IB element combines with the at least one Group VIA element to form a $IB_2VIA$ composition on the back-electrode, iii) monitoring a first deposition state, during the depositing step ii), by making a first plurality of measurements of an indicia of the first deposition state, and iv) terminating or attenuating the depositing step ii) at a first critical control point based on a function of the first plurality of measurements of the indicia of the first deposition state.

5. EXAMPLES

Identifying Critical Control Points by Monitoring Temperature Changes

The following example describes the fabrication of a solar cell based on the exemplary process outlined in FIGS. 2A and 2B, using an exemplary system depicted in FIG. 1A. The starting substrate 102 was a glass tube bearing a sputtered molybdenum back-electrode layer of about 2.5 μm in thickness. The source crucibles were made of graphite. In, Ga, and Se were added to separate crucibles and were heated using resistive to produce a mixed vapor of these elements. The substrate 102 was exposed to the vapor to allow element deposition on the molybdenum layer. Each crucible was equipped with a lid-like device by which the exposure of a certain vapor to the substrate 102 could be stopped. The chamber 130 was pumped to a pressure of around $1.2 \times 10^{-6}$ Torr, using a diffusion pump.

Temperature probes were placed within the chamber 130 and inside the tubular substrate 102 to record temperature measurements during the three-stage deposition process, which were roughly indicated by lines 506 and 508 of FIG. 5. In the first stage, In, Ga, Se were co-evaporated to form a first precursor $(In_xGa_{1-x})_2Se_3$, where x is in the range of 0 to 1. In the second stage, Cu was co-evaporated with Se to convert this precursor to CIGS. Because the presence of $Cu_2Se$ facilitates CIGS formation, the Cu vaporization process was controlled to ensure CIGS formation. In the third stage, In and Ga were co-evaporated with Se to convert any excess $Cu_2Se$ into CIGS product. The transition from the first stage to second stage occurred when Cu vaporization was initiated. The transition from the second stage to the third stage was represented by the termination of Cu vaporization, which took place at the first decision point, illustrated as step 210 in FIG. 2A, based on temperature measurement data taken by monitoring unit 140 and processed by computer system 199. Similarly, the termination of the third stage occurred when In/Ga/Se co-evaporation was terminated, which took place around the second decision point, illustrated as step 218 in FIG. 2B, based on temperature measurement data taken by monitoring unit 140 and processed by computer system 199.

Figure 5A:
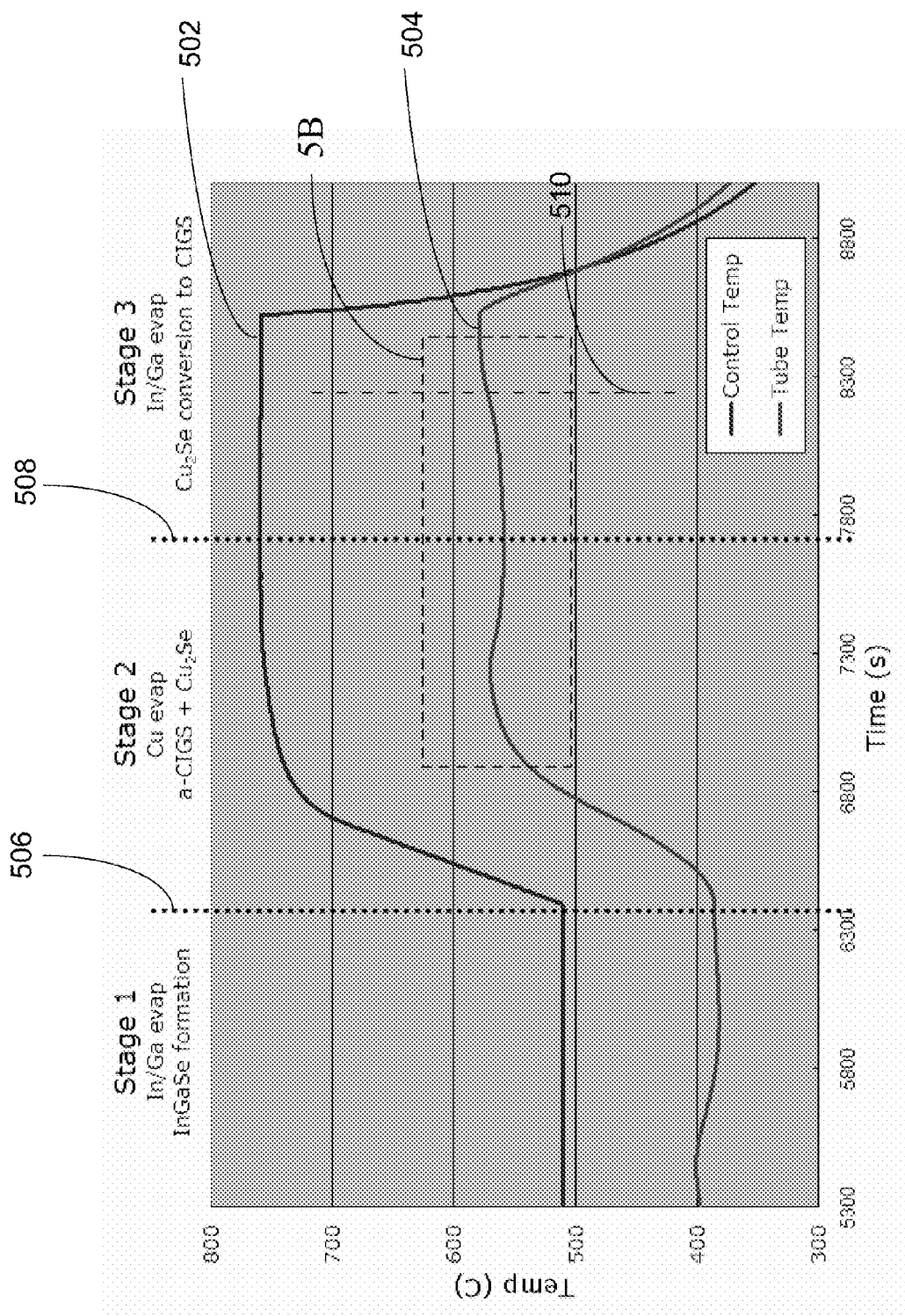
FIGS. 5A and 5B depict exemplary output from a monitoring step in accordance with the present application.
Figure 5B:
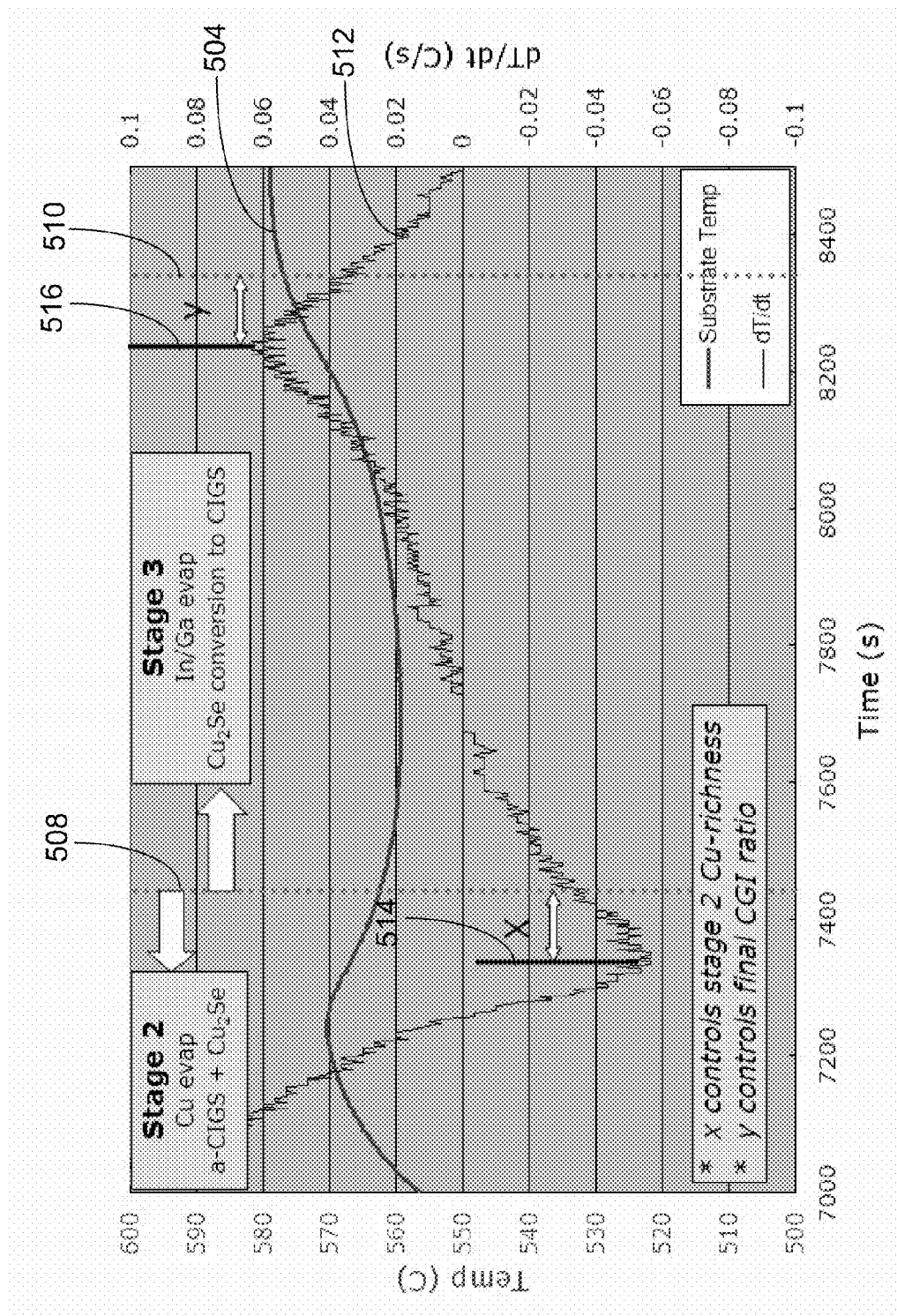

The substrate 102 was heated to 350° C. at the beginning of the first stage. The temperature of the substrate 102 was controlled throughout the deposition process such it always fell between the range of between 350° C. and 700° C. FIG. 5A depicts two curves that detail the temperature changes during a three-stage CIGS deposition process. Temperature changes in the reaction chamber 130 are depicted as curve 502 and temperature changes in tubular substrate 102 are depicted as curve 504. Line 506 represents the transitions separating the first stage and second stage. Line 508 represents the transitions separating the second stage and third stage. In FIG. 5B, line 510 represents the time point where high quality CIGS is formed as excess $Cu_2Se$ disappears. While line 506 may be arbitrarily positioned with the initiation of Cu/Se co-evaporation, identification of appropriate places to position lines 508 and 510 is far less obvious. For example, if Cu vaporization is terminated too early, the absence $Cu_2Se$ results in low quality CIGS. Also, if In/Ga/Se co-evaporation is terminated too early, excess $Cu_2Se$ also results in low quality CIGS. Without intending to be limited to any particular theory, it was hypothesized that the formation of $Cu_2Se$ as well as the depletion of $Cu_2Se$ both correspond to morphological and physical changes in the semiconductor layer; thus changes in indicia of the deposition process are expected. As shown in FIG. 5A, the temperature of the substrate 102, shown as curve 504, changes differently throughout the deposition process than the temperature of the reaction chamber 130 (shown as curve 502). Analytical methods were applied to accentuate the temperature changes inside the substrate 102. FIG. 5B provides an enlarged view of the critical transition period where the termination of Cu/Se co-evaporation and the termination of In/Ga/Se co-evaporation both take place. For example, a first-order derivative with respect to time was taken on each temperature measurement in curve 504 to construct a new curve 512, as depicted in FIG. 5B. The first-order derivative with respect to time, as exemplified by curve 512, revealed two transition points, shown as points 514 and 516 in FIG. 5B. Point 514 indicates a control point for terminating Cu/Se co-evaporation so that sufficient but not excess amount of $Cu_2Se$ was formed to facilitate CIGS formation. Point 516 indicates a second control point for terminating In/Ga/Se co-evaporation so that any residual $Cu_2Se$ was incorporated to form CIGS. FIG. 5B also illustrates how the two critical control points, as indicated by positions 514 and 516, differ from the stage division lines 508 and 510, by distance X and Y. The magnitude of distance X and Y may be adjusted accordingly to optimize the quality of the final CIGS layer.

Alternatively, the second-order derivatives with respect to time were taken for the temperature measurements from any one of the three stages. In that case, the critical control points were not identified as minimum or maximum values on the temperature derivative curve (e.g., points 514 and 516 on curve 512 in FIG. 5B). Instead, they were identified as points where the second derivative values, with respect to time, reach or approach zero (data not shown).

6. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this application can be made without departing from its spirit and scope, as will be apparent to those skilled in the art. The specific embodiments described herein are offered by way of example only, and the application is to be limited only by the terms of the appended claims, along with the full scope of equivalents to which such claims are entitled.

We claim:

1. A photovoltaic module comprising:
 a substrate; and
 a plurality of solar cells linearly arranged on said substrate, the plurality of solar cells comprising a first solar cell and a second solar cell, each solar cell in said plurality of solar cells comprising:
  a back-electrode disposed on said substrate;
  a semiconductor junction disposed on said back-electrode; and
  a transparent conductive layer disposed on said semiconductor junction, wherein
 the transparent conductive layer of the first solar cell in said plurality of solar cells is in serial electrical communication with the back-electrode of the second solar cell in said plurality of solar cells, and wherein a layer of said semiconductor junction is constructed by:
  i) depositing, during a first period of time, at least one Group IIIA element and at least one Group VIA element on said back-electrode;
  ii) depositing, during a second period of time, at least one Group IB element and said at least one group VIA element, on the substrate or on the optional layer that is optionally disposed on the substrate, wherein at least a portion of said at least one Group IB element combines with said at least one Group VIA element to form a $IB_2VIA$ composition on said back-electrode;
  iii) monitoring a first deposition state, during said depositing step ii), by making a first plurality of measurements of an indicia of said first deposition state; and
  iv) terminating or attenuating said depositing step ii) at a first critical control point based on a function of said first plurality of measurements of said indicia of said first deposition state.

2. The photovoltaic module of claim 1, wherein the layer of said semiconductor junction layer is further constructed by:
 v) depositing, during a third period of time, at least one additional Group IIIA element and said at least one Group VIA element;
 vi) monitoring a second deposition state, during said depositing step v), by making a second plurality of measurements of an indicia of said second deposition state; and
 vii) terminating or attenuating said depositing step v) at a second critical control point based on a function of said second plurality of measurements of said indicia of said second deposition state.

3. The photovoltaic module of claim 1, wherein said at least one Group IIIA element comprises Gallium (Ga), Indium (In), Aluminum (Al), or Thallium (Tl).

4. The photovoltaic module of claim 1, wherein said at least one Group VIA element comprises Sulfur (S), Selenium (Se), Tellurium (Te), or Polonium (Po).

5. The photovoltaic module of claim 1, wherein said at least one Group IB element comprises Copper (Cu), Silver (Ag), or Gold (Au).

6. The photovoltaic module of claim 1, wherein said semiconductor layer comprises $CuIn_{1-x}Ga_xSe_2$, $0 \leq x \leq 1$.

7. The photovoltaic module of claim 1, wherein said semiconductor layer comprises $CuIn_{1-x}Ga_x(Se_yS_{1-y})_2$, where $0 \leq x, y \leq 1$.

8. The photovoltaic module of claim 1, wherein said substrate is cylindrical.

9. The photovoltaic module of claim 1, wherein said substrate is planar.

10. The photovoltaic module of claim 1, wherein said first period of time is between 15 minutes and 60 minutes.

11. The photovoltaic module of claim 1, wherein said second period of time is between 15 minutes and 60 minutes.

12. The photovoltaic module of claim 2, wherein said third period of time is between 15 minutes and 60 minutes.

13. The photovoltaic module of claim 1, wherein there is a time gap between said depositing step i) and depositing step ii).

14. The photovoltaic module of claim 13, wherein a precursor is formed on said substrate or said optional layer on said substrate during at least a portion of said time gap.

15. The photovoltaic module of claim 13, wherein a precursor is formed by said at least one Group IIIA element and said at least one Group VIA element during at least a portion of said time gap.

16. The photovoltaic module of claim 1, wherein said function of said first plurality of measurements of said indicia of said first deposition state is a second order derivative, with respect to time, of said first plurality of measurements.

17. The photovoltaic module of claim 16, wherein said first critical control point occurs when said second order derivative, with respect to time, approaches a threshold value.

18. The photovoltaic module of claim 17, wherein said threshold value is zero.

19. The photovoltaic module of claim 2, wherein said function of said second plurality of measurements of said indicia of said second deposition state is a second order derivative, with respect to time, of said second plurality of measurements.

20. The photovoltaic module of claim 19, wherein said second critical control point occurs when said second order derivative, with respect to time, approaches a threshold value.

21. The photovoltaic module of claim 20, wherein said threshold value is zero.

22. The photovoltaic module of claim 1, wherein said $IB_2VIA$ composition is $Cu_2Se$.

23. The photovoltaic module of claim 1, wherein said indicia of said first deposition state is a temperature of said substrate or said optional layer on said substrate, a refractive index of said substrate or said optional layer on said substrate, or a vapor pressure.

24. The photovoltaic module of claim 2, wherein said indicia of said second deposition state is a temperature of said substrate or said optional layer on said substrate, a refractive index of said substrate or said optional layer on said substrate, or a vapor pressure.

25. The photovoltaic module of claim 2, wherein said indicia of said first deposition state and said indicia of said second deposition state are the same.

26. The photovoltaic module of claim 2, wherein said indicia of said first deposition state and said indicia of said second deposition state are different.

27. The photovoltaic module of claim 1, wherein said function of said first plurality of measurements of said indicia of said first deposition state is a first order derivative, with respect to time, of said first plurality of measurements of said indicia of said first deposition state.

28. The photovoltaic module of claim 27, wherein said first critical control point occurs when said first order derivative, with respect to time, falls below a threshold value.

29. The photovoltaic module of claim 28, wherein the first order derivative, with respect to time, falls below said threshold value when said first order derivative achieves a minimum value.

30. The photovoltaic module of claim 27, wherein said first critical control point occurs when said first order derivative, with respect to time, rises above a threshold value.

31. The photovoltaic module of claim 30, wherein the first order derivative, with respect to time, rises above said threshold value when said first order derivative achieves a maximum value.

32. The photovoltaic module of claim 2, wherein said function of said second plurality of measurements of said indicia of said second deposition state is a first order derivative, with respect to time, of said second plurality of measurements of said indicia of said second deposition state.

33. The photovoltaic module of claim 32, wherein said second critical control point occurs when said first order derivative, with respect to time, falls below a threshold value.

34. The photovoltaic module of claim 33, wherein the first order derivative, with respect to time, falls below said threshold value when said first order derivative achieves a minimum value.

35. The photovoltaic module of claim 32, wherein said second critical control point occurs when said first order derivative, with respect to time, rises above a threshold value.

36. The photovoltaic module of claim 35, wherein the first order derivative, with respect to time, rises above said threshold value when said first order derivative, with respect to time, achieves a maximum value.

37. The photovoltaic module of claim 1, wherein said at least one Group IIIA element and said at least one Group VIA element form a precursor $IIIA_2VIA_3$ composition on said substrate or said optional layer on said substrate.

38. The photovoltaic module of claim 37, wherein said precursor $IIIA_2VIA_3$ composition is $(In_xGa_{1-x})_2(Se_yS_{1-y})_3$, where $0 \leq x$, and $y \leq 1$.

39. The photovoltaic module of claim 37, wherein said precursor $IIIA_2VIA_3$ composition is $(In_xGa_{1-x})_2Se_3$, where $0 \leq x \leq 1$.

40. The photovoltaic module of claim 1, wherein the optional layer is disposed on the substrate.

41. The photovoltaic module of claim 40, wherein the optional layer is a back-electrode.

42. The photovoltaic module of claim 1, wherein the optional layer is not disposed on the substrate and the i) depositing step i) deposits at least one Group IIIA element and at least one Group VIA element on the substrate.

* * * * *